(12) United States Patent
Takehashi et al.

(10) Patent No.: US 7,306,980 B2
(45) Date of Patent: Dec. 11, 2007

(54) METHOD FOR FABRICATING THIN FILM TRANSISTOR

(75) Inventors: Shin-itsu Takehashi, Daito (JP); Tetsuo Kawakita, Kyotanabe (JP); Yoshinao Taketomi, Kyotanabe (JP); Hiroshi Tsutsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 373 days.

(21) Appl. No.: 10/872,101

(22) Filed: Jun. 21, 2004

(65) Prior Publication Data
US 2004/0229415 A1 Nov. 18, 2004

Related U.S. Application Data

(62) Division of application No. 10/088,264, filed as application No. PCT/JP00/06261 on Sep. 13, 2000, now abandoned.

(30) Foreign Application Priority Data

Sep. 16, 1999 (JP) ............... H11-262119
Sep. 30, 1999 (JP) ............... H11-278687

(51) Int. Cl.
*H01L 21/00* (2006.01)
*H01L 21/84* (2006.01)
(52) U.S. Cl. ............ 438/163; 438/725; 257/E21.435
(58) Field of Classification Search .......... 438/163, 438/545, 725
See application file for complete search history.

(56) References Cited

U.S. PATENT DOCUMENTS 5,439,837 A * 8/1995 Hata et al. ............ 438/151
5,476,802 A    12/1995 Yamazaki et al. ........ 437/21
5,526,304 A     6/1996 Kawamura ............ 365/154
5,702,960 A *  12/1997 Moon .................. 438/157
5,767,930 A *   6/1998 Kobayashi et al. ...... 349/42

(Continued)

FOREIGN PATENT DOCUMENTS

JP    03-148834    6/1991

(Continued)

OTHER PUBLICATIONS

Kohji Ohgata et al., "A new dopant activation technique for poly-Si TFTs with a slef-aligned gate-overlapped LDD structure", IEEE, IDEM Conference Dec. 2000, pp. 9.3.1-9.3.4.*

(Continued)

*Primary Examiner*—W. David Coleman
(74) *Attorney, Agent, or Firm*—Steptoe & Johnson LLP

(57) ABSTRACT

A number of minuscule LDD thin film transistors with high precision are arranged on a substrate for use in a liquid crystal display apparatus or other similar devices. The gate electrode is used as a mask at the time of injecting impurities into the semiconductor layer. To realize an LDD structure, the impurities are injected in two installments. The size of the gate electrode is changed in accordance with the length of the LDD regions between the first and second injections. The size of the gate electrode is changed by means of metal oxidation or dry etching. For precision dry etching of the gate electrode, various ideas are put into forming the photo resist.

34 Claims, 25 Drawing Sheets

U.S. PATENT DOCUMENTS

| | | | |
|---|---|---|---|
| 5,821,559 A * | 10/1998 | Yamazaki et al. | 257/57 |
| 5,985,701 A | 11/1999 | Takei et al. | 438/154 |
| 6,127,211 A | 10/2000 | Hirao et al. | 438/158 |
| 6,140,164 A | 10/2000 | Zhang | 438/163 |
| 6,160,271 A | 12/2000 | Yamazaki et al. | 257/59 |
| 6,255,705 B1 | 7/2001 | Zhang et al. | 257/412 |
| 6,362,027 B1 * | 3/2002 | Yamazaki et al. | 438/149 |
| 6,444,390 B1 | 9/2002 | Yamazaki et al. | 430/166 |
| 6,534,832 B2 | 3/2003 | Takemura | 257/350 |
| 6,632,709 B2 * | 10/2003 | Ayres et al. | 438/149 |
| 6,677,189 B2 * | 1/2004 | Dai et al. | 438/149 |
| 2001/0041392 A1 * | 11/2001 | Suzawa et al. | 438/149 |

FOREIGN PATENT DOCUMENTS

| | | |
|---|---|---|
| JP | 5-55246 | 3/1993 |
| JP | 05-082552 | 4/1993 |
| JP | 06-112222 | 4/1994 |
| JP | 7-183403 | 7/1995 |
| JP | 08-032080 | 2/1996 |
| JP | 08-148691 | 6/1996 |
| JP | 9-146266 | 6/1997 |
| JP | 9-298304 | 11/1997 |
| JP | 10-233511 | 9/1998 |
| JP | 11-163368 | 6/1999 |
| JP | 11-168221 | 6/1999 |

OTHER PUBLICATIONS

"Laser Crystallised Poly-Si Circuits for AMLCDs" Edwards, M.J., et al. Asia Display '95, pp. 335-337.

"New Poly-Si TFT Structure for OFF-Current Reduction" Bae, B.S., et al. SID '96 DIGEST, pp. 25-28.

AMLCDs and Electronics on Polymer Substrates Young, N.D., et al. Euro Display '96, pp. 555-558.

"Gate-Overlapped Lightly Doped Drain Poly-Si Thin-Film Transistors for Large Area-AMLCD" Choi, Kwon-Young, et al. IEEE Transaction on Electronic Devices, vol. 45, No. 6, Jun. 1996, pp. 1272-1279.

* cited by examiner

METHOD FOR FABRICATING THIN FILM TRANSISTOR

This is a division of application Ser. No. 10/088,264 filed Mar. 18, 2002, now abandonded which in turn is a national stage entry of International Application No. PCT/JP00/06261 filed Sep. 13, 2000 designating the U.S., which claims the benefit of Japanese Application Nos. H11-262119 filed Sep. 16, 1999 and H11-278687 filed Sep. 30, 1999.

TECHNICAL FIELD

The present invention relates to a thin film transistor and a method for fabricating the same, and more specifically, to a thin film transistor used as a pixel switching element or a driving circuit or other similar devices in a liquid crystal display apparatus.

BACKGROUND ART (General Background Art)

In recent years, there have been enthusiastic studies on active matrix display apparatuses in which every pixel electrode of the liquid crystal panel is provided with a thin film transistor (hereafter referred to as TFT) because of their higher image quality than simple matrix display apparatuses. Above all, so-called built-in driving circuit-type liquid crystal display apparatuses, in which TFTs as pixel switching elements and driving circuits are mounted on the same glass substrate with the use of polysilicon, have been suggested and studied because the mobility of electrons in the polysilicon TFT is one or two digit higher than that of the amorphous silicon TFT.

However, the polysilicon TFT used to build the driving circuit in has a larger OFF current than the amorphous TFT or the MOSFET, and this problem will hinder the realization of the built-in driving circuit-type liquid crystal display apparatus with polysilicon TFTs.

In order to solve this problem in electronic properties of the polysilicon TFT, it has been suggested and studied to realize a TFT structure where the OFF current is reduced and the ON current is maintained by forming a sub-gate structure and provide an low concentration impurity-doped region (LDD: Lightly Doped Drain) adjacent to at least one of the source and drain regions of a TFT (SID96 DIGEST pp25: Samsung electron, Euro Display '96 pp555, ASIA Display'95 pp355: Philips).

The structure of such a thin film transistor is shown in FIG. 1.

In the figure, numeral 1 denotes a glass substrate having a buffer layer for preventing the internal substances from migration on the upper surface (in the drawing) thereof. Numeral 2 denotes a polysilicon semiconductor layer. Numeral 3 denotes a gate insulator film. Numeral 4 denotes a gate electrode. Numeral 40 denotes a sub gate electrode, and numerals 45 and 46 on the left and right portions thereof denote sub gate electrodes of which ends sticking out in the channel direction. Numerals 245 and 246 denote low concentration impurity doped regions (hereinafter often referred to as LDD regions) of the polysilicon semiconductor layer 2. Numeral 25 denotes a source region (n+ layer) of the layer. Numeral 26 denotes a drain region (n+ layer) of the layer. Numeral 24 denotes a channel region of the layer. Numeral 5 denotes a source electrode. Numeral 6 denotes a drain electrode. Numeral 7 denotes an interlayer insulator film.

In actual, a number of such TFTs shown in the figure are formed on a glass substrate of 30 cm×40 cm or so in row and column manner in accordance with the arrangement of pixel areas and driving circuit units in their vicinities, and necessary with wirings. However, they are not illustrated because of being obvious.

On the gate electrode 4 of this TFT, the sub gate electrode 40 is provided so as to cover the electrode, and the low concentration impurity-doped regions (LDD region: n– layers) 245 and 246 are formed directly below the portions 45 and 46 of sub gate electrode, both sticking out from the gate electrode 4.

These low concentration impurity-doped regions are generally formed as follows. After forming the gate electrode 4, injection of low-concentration impurities are made into the polysilicon semiconductor layer 2 beneath the gate insulator film via the gate insulator film by using the gate electrode 4 as a mask. Thus, the region directly below the gate electrode is prevented from injection of impurities thereby a channel region is formed on this region of the polysilicon semiconductor layer. Then the remaining regions, which are not covered by the gate electrode 4, are lightly doped with the impurities.

Next, a metal film which is to be processed into the sub gate electrode 40 is formed on the gate electrode 4 and unnecessary portions of the metal film are removed by photolithography and etching to form the sub gate electrode 40 made of the metal film which covers only the top and side surfaces of the gate electrode. As a result, the sub gate electrode 40 has end portions 45, 46 sticking out in a predetermined amount in the channel direction (in the direction of the source electrode and the drain electrode).

Finally, impurities of far higher concentration than those injected earlier are injected.

Hence, the regions of the semiconductor layer that are not covered with the sub gate electrode are heavily doped with impurities thereby the source region 25 and the drain region 26 are formed, whereas the portions covered with the sub gate electrode are not doped with impurities thereby the low concentration impurity-doped regions 245 and 246 are formed directly below the portions sticking out from the gate electrode. The size of the low concentration impurity-doped regions is set at 100-10% of the channel width of the TFT.

As described hereinbefore, in the polysilicon TFT, in order to overcome the drawback of the electric property that the OFF current is large, it is essential to provide a minuscule low concentration impurity-doped region (LDD: Lightly Doped Drain) adjacent to at least one of the source region or the drain region of the TFT.

(Background Art in Terms of the Problems the Invention is Going to Solve)

However, the formation of these low concentration impurity-doped regions accompanies with the following problems.

1) Achieving high fineness in a liquid crystal display apparatus requires increasing the display density by downsizing pixel transistors. An exposing device most commonly used for the fabrication of a liquid crystal display apparatus is a proximity exposure unit. Although it is necessary in the fabrication of a minuscule pixel transistor to form a low concentration impurity-doped region as small as 10-25% of the channel width of the pixel transistor with precise dimensions and good reproducibility, this is therefore extremely difficult.

2) The sub gate electrode and the low concentration impurity-doped regions are positioned by a mask positioning; however, it is difficult to position them with high precision. For this, a small amount of deviation in the mask positioning may cause the dimensions of the low concentration impurity-doped regions to vary more than an ignorable degree in the actual use. Therefore, in order to secure the margin for the mask positioning in the fabrication process, the pixel TFT can become minuscule only in a limited range, and the pixel TFT must take up an extra area for the margin.

3) The pixel TFT takes up a larger area, which increases the parasitic capacitance between source region and drain region, thereby causing a delay in the operational waveform, leading to a decrease in the display properties of the liquid crystal display apparatus.

4) The formation of the sub gate electrode requires some processes, besides for the formation of the gate electrode, such as forming a metal film, photolithography and etching, and further requires a photomask for the photolithography. The TFT fabrication is thus complicated, possibly causing an increase in the production time and cost, and a decrease in the yield.

Although it is not limited to the LDD thin film transistor, there has been the demand of minimizing undesirable influence by the hydrogen implanted at high energy to dilute impurities at the time of injection to the crystalline structure of the semiconductor.

There is the other demand for low electric resistance in each component so as to obtain display properties of high quality such as uniform brightness across a large display surface, and at the same time, for simple fabrication with a low cost.

In a display apparatus, the properties required for transistors differ, for example, between the pixel unit and the peripheral circuit unit. In some type of devices, there is the demand for an offset transistor having no impurity-injected regions both ends of the channel region provided below the gate electrode in the channel direction.

Therefore, in order to reduce the OFF current and to maintain the ON current of the polysilicon thin film transistor, it has been hoped to realize the art of fabricating a thin film transistor with small parasitic capacitance in an extremely simple manner by forming minuscule LDD regions with high fineness adjacent to the source region and the drain region of the TFT either in a self-aligned manner or inevitably adjacent to the gate electrode without a special mask positioning process.

The development of the same technique has been hoped for the offset transistor.

It is also hoped for other types of transistors having various properties, besides the LDD transistor and the offset transistor.

DISCLOSURE OF THE INVENTION

The present invention has been contrived to solve these problems, and various ideas are put into the formation of a gate electrode, in order to employ the gate electrode as a mask at impurity injection in the fabrication of a thin film transistor. To be more specific, according to a first invention group, in formation of the gate electrode by photolithography and etching, the photo resist isolated in alignment with the gate electrode by etching is designed to have a smaller width in cross section at least in the top than in the bottom in the channel direction. Consequently, it becomes easier to remove both ends of the photo resist in the channel direction and to slightly expose the metal under the ends, as compared with the case where the photo resist has a uniform thickness.

Then, the photo resist of this shape is ashed at least at its ends in the channel direction to expose both ends of the gate electrode in the channel direction, the exposed region of the gate electrode is etched, then the gate electrode is used as a mask for injecting low-concentration impurities, thereby forming low concentration impurity-doped region (LDD: lightly doped drain) with extremely high accuracy in a self aligned manner.

A second invention group is equal to the first invention group in that the gate electrode is used as a mask in impurity injection, but is different in that the metal for the gate electrode is oxidized for the formation of the LDD structure. The metal for the gate electrode is removed or reduced by hydrogen to return to the metal after the impurity injection. To be more specific, each invention group has the following features.

In one invention of the first invention group, a gate electrode is provisionally formed by photolithography and etching the metal film for the gate electrode with the use of a resist (photo resist) in alignment with the arrangement and shape of the gate electrode on the substrate, then impurity ions are injected in high concentrations into the semiconductor layer while using the provisional gate electrode as a mask and the resist thereon as a subsidiary mask. Then, at least both ends of the resist in the channel direction (actually the top surface, too) are removed in a certain amount by etching, especially by ashing with the use of plasma reaction, so as to expose both ends of the gate electrode in the channel direction. Next, the exposed ends of the provisional gate electrode in the channel direction are removed by dry etching which is done, for example, by exposing it to a predetermined reactive material from the upper side with the use of the resist as a mask. Furthermore, regardless of the presence or absence of the resist, while using the gate electrode as a mask, impurities are injected into the semiconductor layer lightly (in low concentrations). Consequently, the regions of the semiconductor layer that were directly below the dry-etched ends of the provisional gate electrode (where end surfaces of the resist were moved to the center thereof) in the channel direction are lightly doped with impurities. As a result, minuscule LDD regions is formed in the semiconductor layer in a self aligned manner with respect to the gate electrode (on opposite sides of the gate electrode in the channel direction and inevitably adjacent to the gate electrode without a special mask positioning process).

It goes without saying that these processes are done after the formation of the semiconductor layer on the substrate, the isolation (patterning) of the semiconductor layer, and laser annealing. It also goes without saying to perform the removal of the resist (having no effects as a mask) before or after the second injection of impurities, the heat treatment of the semiconductor layer, the formation of the protective insulator film, and the formation of the source and drain electrodes.

In another invention, the resist has tapered (inclined) ends (the surface of the tapered ends are not necessarily linear) on both sides of the provisional gate electrode in the channel direction at the time when the provisional (tentative) gate electrode has been formed, at the time when the first injection of high-concentration impurities has been done, or in some cases, at the time when the resist has been isolated from each other on a metal film which is the material of the gate electrode in accordance with the position of the gate electrode so as to pattern the metal film. After the first injection of high-concentration impurities, both ends of the resist in the channel direction on the gate electrode are pushed back (removed) by ashing or other methods. Since the resist is formed wider downward in the channel direction (in the substrate and semiconductor layer side), the regions of the resist that are above both ends of the gate electrode in the channel direction can be easily removed earlier than others (at high accuracy in the channel direction because of the inclination). Then, the ashing is ceased when the ends of the resist have been slightly removed but the most part of the resist above the gate electrode (including the central part) is left. While using the remaining resist as a mask, both sides of the metal in the channel direction which is to be the provisional gate electrode are removed to form the gate electrode. Then, impurities are injected lightly while using the remaining gate electrode (and the remaining resist as well) as a mask. As a result, LDD regions are formed in the semiconductor layer directly below the portions where the metals forming the provisional gate electrode in the channel direction were removed.

In still another invention, various ideas are put into making the resist isolated either on the metal layer which is to be the gate electrode or on the isolated gate electrode, have tilted end surfaces in the channel direction. To be more specific, the resist is made to have a semicircular cross section (including a rough semicircle or an oval) in the channel direction by heat-shrinking or fluidizing at temperatures near the melting point, thereby eventually sphering it (when the gate electrode has a cross section of a right square, it is usually semispherical in shape).

The postbake temperatures to solidify the resist are set higher than the optimum temperatures in order to avoid the resist material from deforming. This makes the top portion of the resist shrink while solidifying, and both ends of the resist in the channel direction have tilted surfaces.

Alternatively, the resist of two layers is employed while utilizing the same heat shrinking. In this case, the bottom layer of the resist has higher postbaking temperatures than the top layer of the resist, and the postbaking process is carried out after exposure and development at temperatures appropriate for the bottom layer. Since the bottom layer of the resist is subjected to the postbaking at the optimum temperatures, the bottom layer can be aligned with high precision for forming the gate electrode. On the other hand, the top layer of the resist, which is subjected to temperatures higher than its postbaking temperatures, heat shrinks. Consequently, the two-layer resist as a whole has a shrunk top and a downwardly broadened cross section in the channel direction. Since thinner portions of the resist are removed earlier in ashing, this shape of the resist enables both ends of the gate electrode in the channel direction to be exposed first to a slight extent.

In other mode, the prebaking of the resist prior to exposure and development is done at lower temperatures than defined, which facilitates the resist to be impregnated entirely with a developing solution in the development after the exposure. When the resist is isolated in accordance with the arrangement and shape of the gate electrode, it is formed to broaden downwards. In this case, the exposure mask larger to some degree can be employed depending on whether the resist is negative or positive.

In still other mode, when the resist is exposed in accordance with the position and shape of the gate electrode to form the gate electrode, the exposure is done out of focus. This leads the photo resist being exposed to broaden downwards. As a result, the resist broadens downwardly in shape.

In still further mode, the photomask used to expose the (photo) resist for the formation of the gate electrode is a perforated pattern, and accordingly, the (photo) resist is negative. This feature of the resist, together with the effect of diffraction obtained by having fine pores, facilitates the exposure broadening downwards. Consequently, similar to the above inventions, the resist broadens downwards in shape.

The resist formed on the provisional gate electrode by being isolated in accordance with the arrangement and shape of the gate electrode is melted with heat for shaping like a hemisphere by the surface tension. As a result, the resist broadens downwardly in shape.

In this case, the resist of a melt flow type which melts at temperatures of 120-200° C. may be employed. This facilitates the resist to be shaped like a hemisphere with heat.

In yet another mode, a single-layer resist isolated on the provisional gate electrode is exposed to higher temperatures than the postbake temperatures to be heat shrunk, after the formation of the provisional gate electrode and before the etching of the isolated resist. Consequently, the top surface of the resist is shrunk; however, the other portions in contact with the provisional gate electrode being restrained remain unchanged. As a result, the resist broadens downwardly in shape in the channel direction.

In still yet another mode, when the resist is put in a chemical reaction with a fluid, unlike etching or other similar methods by which a fluid is implanted from above, the surfaces of both ends are removed according to area proportion method. As a result, both ends because of their large resist amount-to-reaction area ratio are removed first. If necessary, a reactive gaseous fluid is insufflated from both sides above in the channel direction. This makes upper portions of the ends of the resist in the channel direction more exposed to the gas. This leads the resist broaden downwardly with both end surfaces in the channel direction being tilted. In this case, the exposure mask for forming the patterned resist being slightly larger than the one to be formed using the resist and having a rectangular cross section may be employed.

In another invention, in order to use the isolated provisional gate electrode as a mask at the time of injecting low-concentration impurities for forming the LDD regions, it is necessary to remove both ends of the provisional gate electrode in the channel direction to a small extent.

$O_2$ (oxygen), $O_3$ (ozone), or a gas containing both of them is employed for moving both ends of an organic resist as the mask in the channel direction towards the center to a small extent when the provisional gate electrode is etched. As a result, the resist is oxidized by the plasma reaction of oxygen, thereby enabling the ashing process with high accuracy.

According to one mode, in the method of fabricating an offset thin film transistor where the semiconductor layer has minuscule regions not doped with impurities on opposite sides of the channel region in the channel direction below the gate electrode, the provisional gate electrode is used as a mask for injecting impurities, and thereafter, the ends of the gate electrode in the channel direction are removed to a small extent. Before this removal of the gate electrode, it is necessary to slightly remove both ends of the resist in the channel direction that is used for the formation of the provisional gate electrode and still exists on the provisional gate electrode even after the impurity injection. This is achieved by using the same technique as in the aforementioned inventions concerning a method of fabricating an LDD transistor. Later, both ends of the provisional gate electrode in the channel direction are removed with the use of the remaining resist as a mask.

Another invention relates to a bottom-gate LDD thin film transistor. In this invention, rear surface exposure is conducted by using UV rays and probably X rays in the future to form a metal mask for impurity injection in a self aligned manner directly onto the regions of the semiconductor layer that are directly above the gate electrode. The minuscule areas of both ends of the metal mask in the channel direction are removed by the same method as in the aforementioned inventions related to the top-gate thin film transistor. Furthermore, both ends of the resist in the channel direction which is formed thereon are broadened downwards by ashing.

In still another invention, unlike the above-described invention where the metal mask is provided directly on the semiconductor layer, an insulating protective film is provided above the semiconductor layer, and a metallic mask is formed directly thereon. Although the provision of the insulating protective film causes the disadvantage of increasing the acceleration voltage at the time of impurity injection, this makes it unnecessary to take measures against contamination of the semiconductor layer with the metal.

Further invention relates to an electroluminescence display apparatus employing the thin film transistors of the aforementioned inventions.

Still further invention relates to a liquid crystal display apparatus employing the thin film transistors of the aforementioned inventions.

In yet another invention, the resistance value of the LDD regions of the LDD transistors of the first invention group is set in a range determined by the performance and other conditions of the products.

Yet another invention employs polysilicon as the semiconductors of the transistors of the first invention group.

In one invention of the second invention group, the LDD thin film transistor is fabricated by using a gate electrode thereof as a mask at the time of injecting impurities into a semiconductor layer. In this case, however, in order to realize the LDD structure, the injection is done in two installments; low-concentration impurities are injected in the first installment, and then after the gate electrode is oxidized and extended towards its ends in the channel direction, high-concentration impurities are injected in the second installment to form LDD regions. As a result, the surface of the gate electrode is coated with the insulating reaction product film of the gate electrode material. Here, the thickness of the gate electrode and the length of the LDD regions are determined by taking not only the performance of the transistors but also the mask performance at the time of impurity injection, the amount of reaction of the metal in the provisional gate electrode, and the thickness and proceeding direction of the reaction product film in forming the reaction product-film into consideration. The proceeding direction is also used to control the amount of the offset.

The oxide film may be a thermally oxidized film formed by being reacted with oxygen or steam at temperatures not exceeding 600° C. which is the upper limit of the durability of the substrate, and more preferably, 400-500° C. Hence, the thickness of the oxide film can be controlled easily.

The gate electrode may be made from the alloy containing Mo (molybdenum) of 15-35 atom %, preferably 15-35 atom %, more preferably 33-37 atom % and W (tungsten). Here, the alloy includes an intermetallic compound, a solid solution, or a mere mixture of fine powers of Mo and W obtained by, i.e., sputtering. The obtained alloy has a smaller electric resistance than W and is chemically more stable than Mo.

Since the side portions of the oxidized gate electrode can be easily reduced by hydrogen and these metals both having a high density, the gate electrode of such material shows high performance as the mask at the time of impurity injection. Therefore, the gate electrode performs excellent resistance against implanting of hydrogen used for diluting the impurities into the regions of the semiconductor layer that are directly under the gate electrode not only being decreased in thickness.

The insulating reaction product film makes the side portions (and top surface, too in reality) of the gate electrode expand in the channel direction to a predetermined amount by oxidation or other methods. This expansion of the gate electrode material by oxidation or other methods in the channel direction can be controlled precisely. Therefore, the LDD regions can be formed with high precision in spite of their minuscule size.

Another invention is equal to some of the aforementioned inventions in that an LDD transistor is realized by utilizing the expansion of the gate electrode in the channel direction by oxidation. However, this invention differs from them in that it has the process of removing the oxidized metal formed on both ends of the gate electrode in the channel direction, and also on the top surface in reality. Therefore, the properties of the transistors are different from those in the other inventions to some extent, and they can be more preferable depending on the use of the product.

Still another invention is equal to some of the aforementioned inventions in that an LDD transistor is realized by utilizing the expansion of the gate electrode, which is used as a mask at the time of impurity injection, towards both ends in the channel direction by oxidation. However, this invention differs from them in that it has the process of reducing the metallic oxide film after the impurity injection. Consequently, transistors having different properties from those in the other inventions can be obtained.

In still further invention, after the metal film which is to be the gate electrode is oxidized, a predetermined amount of impurities are injected from diagonally above in the channel direction at high voltages and with an energy 1.5-2.5 times more. As a result, the impurities, especially light ones like boron repeatedly collide inside the oxidized metal for the gate electrode and the gate insulating layer until they stops because of their high energy thereby intrude even into the regions of the semiconductor layer that are near the center in the channel direction under the gate electrode due to scatterings. Hence, LDD regions are completed.

Next, high-concentration impurities are injected from directly above the gate electrode.

In yet another invention, impurities having predetermined concentrations are injected at high voltages while using as a mask the gate electrode having oxide films formed at both ends in the channel direction. Similar to the above-described invention, the impurities are diffused into the gate insulator film and further intrude into the regions of the semiconductor layer that are directly below the metal oxide film. After this, high-concentration impurities are injected at normal voltages, and then the metal oxide film is removed. Then, at the time of heating such as the subsequent expulsion of hydrogen or the thermal treatment of the semiconductor layer, the impurities travel due to thermal diffusion toward the center of the semiconductor layer that is directly below the region where the metal oxide film once existed. Hence, LDD regions are completed.

In yet further invention, in order to fabricate an offset thin film transistor, high-concentration impurities are implanted from above while using as a mask the gate electrode having metal oxide films at both ends in the channel direction. Later, the metal oxide films are removed.

The dispersion and thermal diffusion of impurities are taken into consideration.

In still further invention, the semiconductors of the thin film transistors of the second invention group are made from polysilicon.

EXPLANATION OF REFERENCE NUMBERS

| | |
|---|---|
| 1 | glass substrate |
| 11 | buffer layer (SiO$_2$) |
| 2 | (amorphous) silicon layer |
| 20 | polysilicon layer |
| 21 | polysilicon layer isolated from each other just like islands |
| 245, 246 | lightly doped drain (LDD) regions |
| 24 | channel region |
| 240 | offset region |
| 25 | source region |
| 26 | drain region |
| 3 | gate insulator film |
| 4 | gate electrode/provisional gate electrode |
| 40 | sub gate electrode |
| 41 | gate electrode obtained by etching the provisional gate electrode |
| 411 | oxide film |
| 45 | sub gate electrode end on the source electrode side |
| 46 | sub gate electrode end on the drain electrode side |
| 48 | metal film for gate electrode |
| 5 | source electrode |
| 6 | drain electrode |
| 7 | interlayer insulator film |
| 8 | photo resist |
| 80 | photo resist (negative) |
| 81 | photo resist (patterned) |
| 810 | trapezoidal photo resist |
| 82 | photo resist (ashed) |
| 820 | trapezoidal photo resist (ashed) |
| 83 | photo resist (bottom layer) |
| 84 | photo resist (top layer) |
| 844 | trapezoidal photo resist (top layer) |
| 85 | melt-type photo resist |
| 88 | protective film |
| 9 | photomask |
| 90 | perforated pattern photomask |
| 95 | metal film for mask formation at the time of impurity injection |
| 96 | metal mask at the time of impurity injection |
| 961 | oxidized portions of the metal mask at the time of impurity injection |
| 97 | metal mask for LDD region formation |

DESCRIPTION OF THE PREFERRED EMBODIMENTS

The present invention will be described as follows based on the embodiments.

Embodiment 1

In the present embodiment, the gate electrode functioning as a mask at the time of impurity injection is obtained in two steps, and the impurity injection is carried out twice. To realize this, various ideas are put into the ashing of the photo resist used to etch miniscule areas of both ends of the gate electrode in the channel direction.

Figure 1:
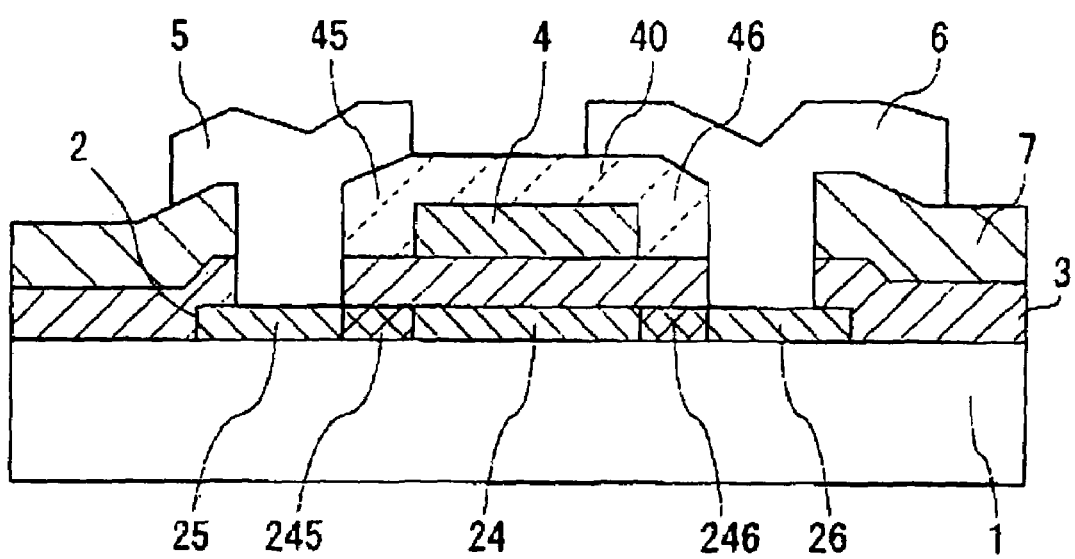
FIG. 1 shows the cross sectional view of the prior art thin film transistor.
Figure 2:
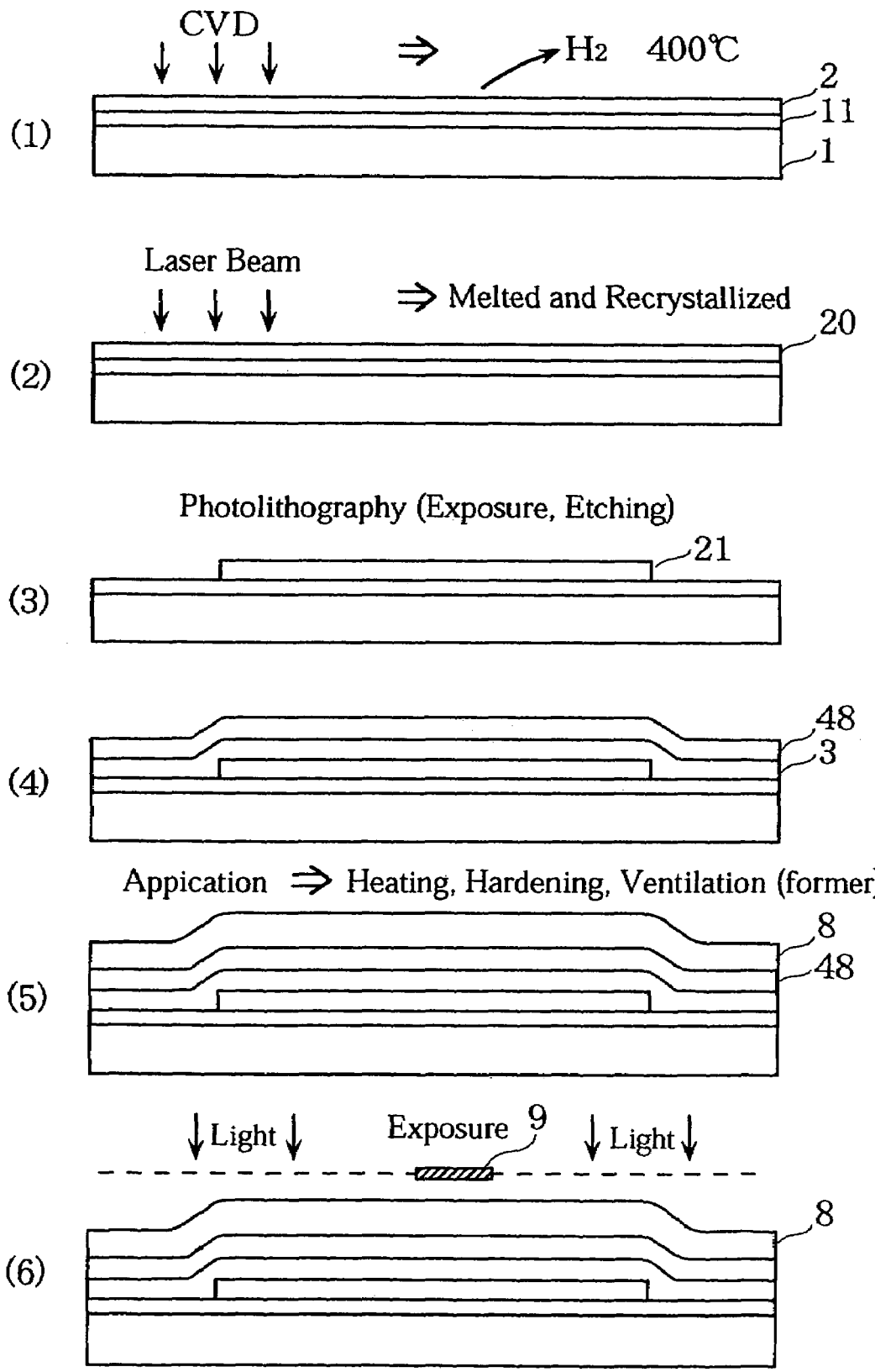
FIG. 2 shows the cross sections of the first half processes in the method of fabricating the thin film transistor of Embodiment 1 of the present invention.
Figure 3:
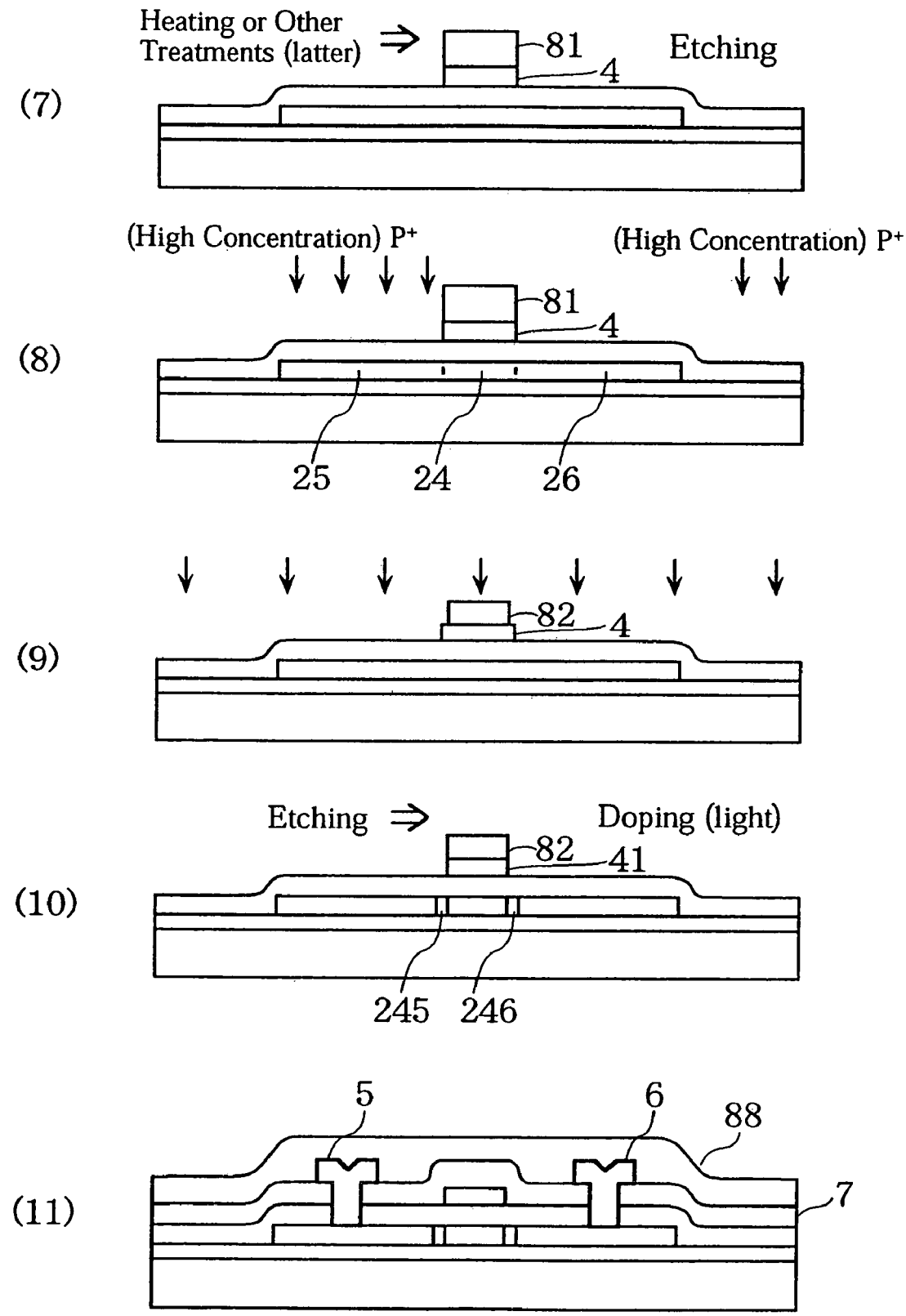
FIG. 3 shows the cross sections of the second half processes in the method of fabricating the thin film transistor of Embodiment 1 of the present invention.

FIGS. 2 and 3 show the manufacturing steps in the method of fabricating the thin film transistor of the present embodiment. These sequential steps are separately shown in FIGS. 2 and 3 on account of space.

The following description is based on FIG. 2.

(1) An amorphous silicon layer 2 is deposited as thick as 500 to 1000 Å on the top surface of a glass substrate 1 having a $SiO_2$ film formed thereon as a buffer layer by plasma CVD or decreased-pressure CVD. Then, while the amorphous silicon layer is crystallized by laser annealing, dehydrogenation is conducted at 400° C. to prevent the abrasion of the amorphous silicon layer 2 due to the dissociation of hydrogen therefrom.

(2) The amorphous silicon layer is radiated with an excimer laser having a wavelength of 308 nm so as to be melted once, and then re-crystallized (poly-crystallized) to form a polysilicon layer 20.

(3) The polysilicon layer is isolated from each other just like islands corresponding to individual semiconductor elements by photolithography, thereby forming a polysilicon layer 21.

(4) A 1000 Å-thick $SiO_2$ (silicon dioxide) layer 3 which is to be a gate insulator film is formed on the glass substrate 1 in such a manner as to cover the polysilicon layer 21. Then, a metal layer 48 of Al, Mo, Ta or the like for gate electrode formation is formed further thereon.

(5) A photo resist 8 is applied on the metal layer 48 for gate electrode formation, and prebaking (heating in a ventilated condition) is performed under predetermined conditions.

(6) In order to form a gate electrode, exposure is conducted with the application of a photomask 9.

The following description is based on FIG. 3.

(7) After the photo resist is developed, photolithography is conducted to remove exposed regions of the photo resist. The remaining photo resist is completely hardened by postbaking under predetermined conditions. Then, the metal layer 48 for gate electrode formation is etched while using the photo resist 81 left in the form of a photomask, so as to form a provisional gate electrode 4.

(8) The first injection of impurities is performed by ion doping with phosphorous ions while using the provisional gate electrode 4 as a mask and the photo resist directly above it as a subsidiary mask. The phosphorous ions are injected in high concentrations. As a result, the region of the polysilicon layer 21 that is directly below the provisional gate electrode 4 is not doped with the impurities. This central region becomes the channel region, and its both sides in the channel direction (left and right regions in the drawing) become LDD regions, which will be detailed below. The regions of the polysilicon layer 21 that are left and right to the channel region in the drawing become heavily doped regions (n+ layers) into which high-concentration impurities are injected, so as to form a source region and a drain region, respectively.

(9) The photo resist 81 is etched, for example, by means of ashing with $O_2$ and ozone in horizontal and downward directions equally in length so as to move its ends in the channel direction (and also top surface, to be exact) towards the center, thereby exposing minuscule areas of both ends of the provisional gate electrode 4 in the channel direction. The amount of exposure in both ends of the provisional gate electrode is set at about 0.2-0.5 µm when the gate electrode 4 has a width of 2 µm by controlling the ashing conditions.

(10) Minuscule both ends of the gate electrode 4 that are exposed in the channel direction from the photo resist 82 are removed by etching with the application of a fluid from above, thereby forming the gate electrode 41. The second injection of the impurities is then performed by ion doping with phosphorous ions while using this gate electrode 41 as a mask.

In this case, the impurities are injected in lower concentrations than in the former injection. Consequently, the regions of the polysilicon layer that are directly below both ends of the gate electrode, which have been removed by etching, are lightly doped with the impurities. Hence, low-concentration impurity regions (n– layers) 245 and 246 having a minuscule width are formed as LDD regions.

(11) After the photo resist 82 is removed, an interlayer insulator film 7 made of $SiO_x$ or the like is so formed as to cover the gate electrode 41. Next, the interlayer insulator film and the gate insulator film 3 are provided with contact holes for source and drain electrode formation. A metal layer made of Al, Mo, Ta or the like is formed by sputtering to fill these contact holes, then the obtained metal layer is patterned into a predetermined shape to form a source electrode 5 and a drain electrode 6. Finally, a protective film 88 made of SiN or other material is formed to complete the thin film transistor.

Embodiment 2

In the present embodiment, the resist provided on the provisional gate electrode is heat shrunk and deformed to have a nearly trapezoidal cross section, and by using this resist, the provisional gate electrode is processed into a mask for LDD formation.

Figure 4:
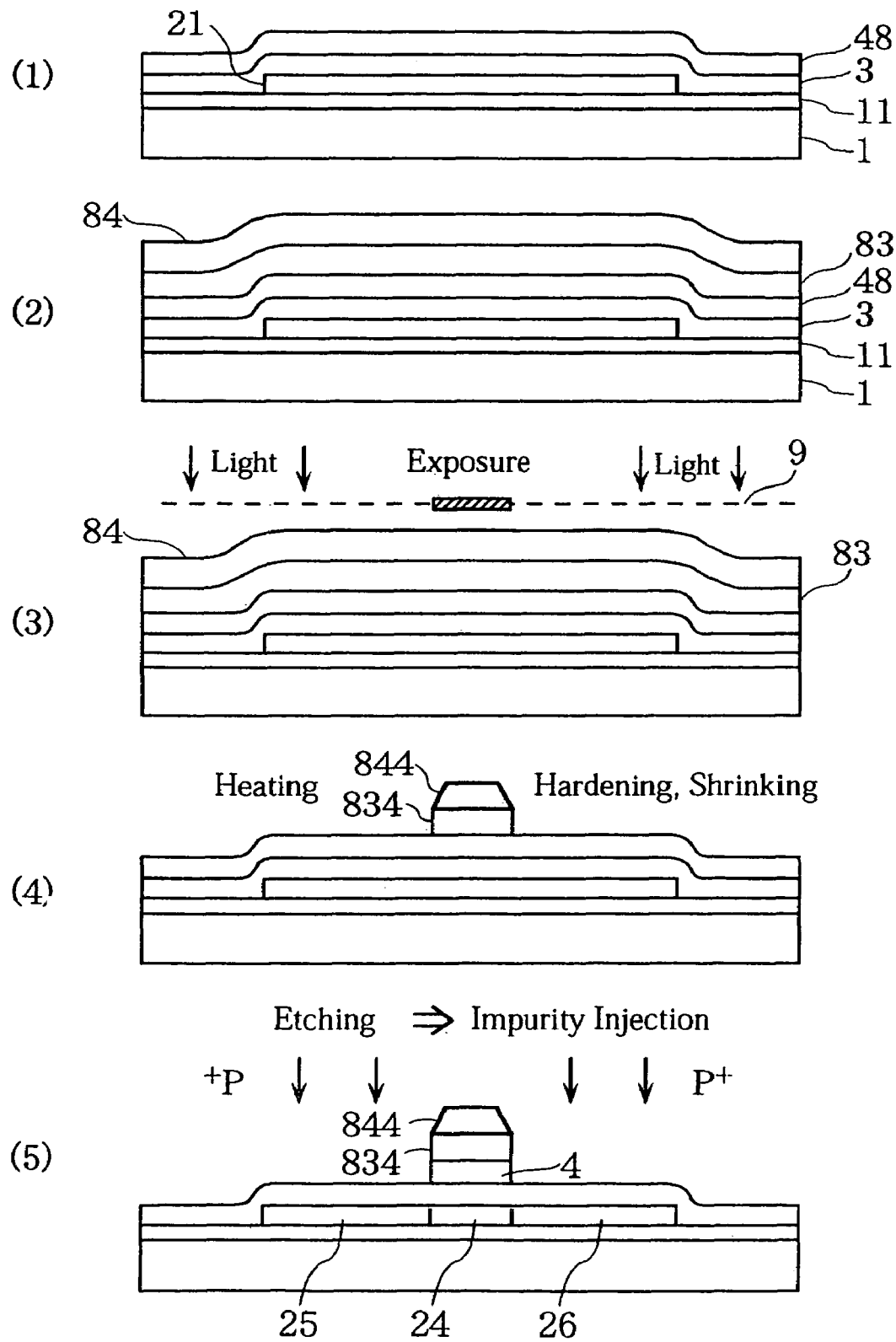
FIG. 4 shows the cross sections of the first half processes in the method of fabricating the thin film transistor of Embodiment 2 of the present invention.
Figure 5:
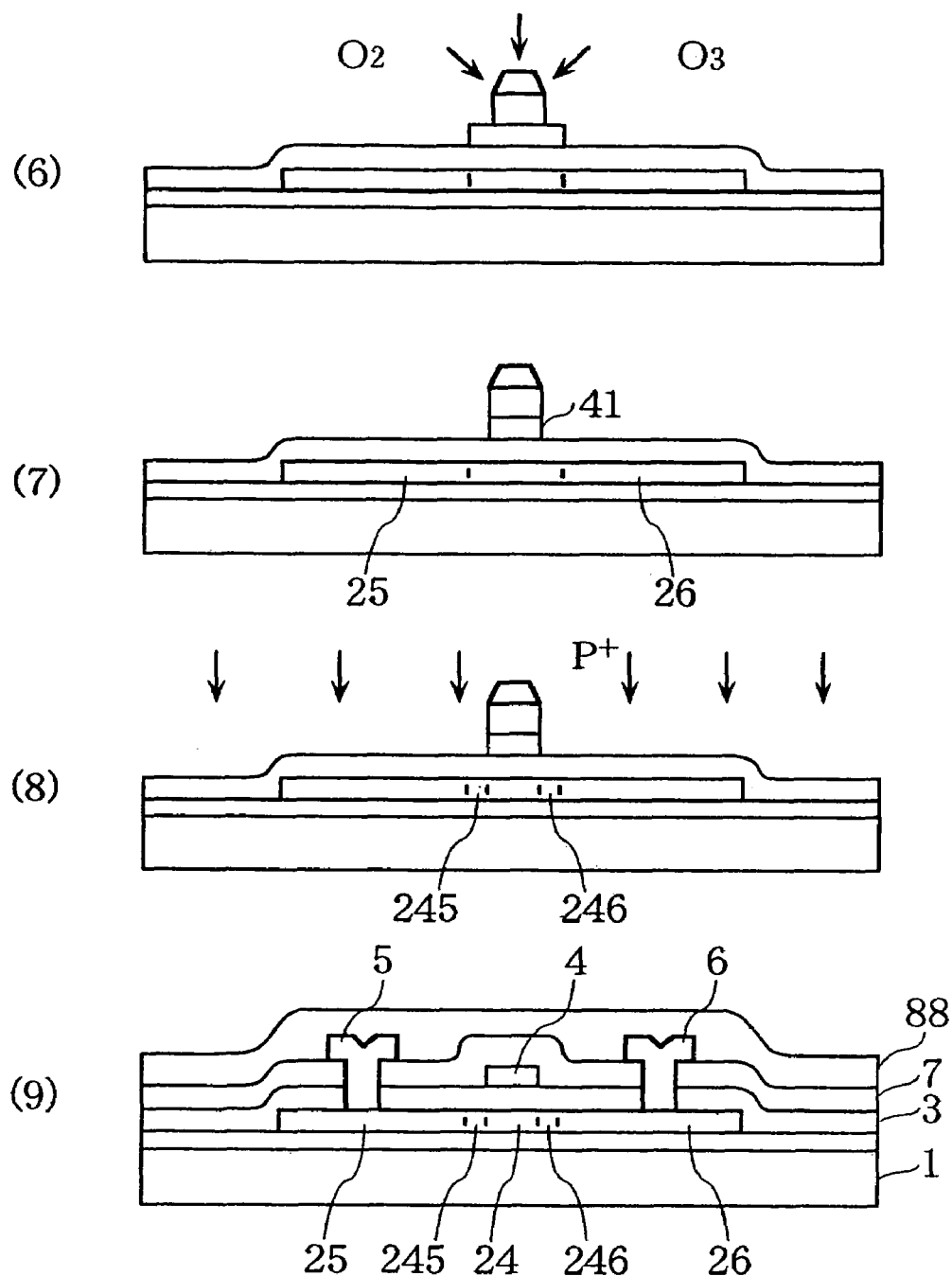
FIG. 5 shows the cross sections of the second half processes in the method of fabricating the thin film transistor of Embodiment 2 of the present invention.

FIGS. 4 and 5 depict the method of fabricating the thin film transistor of the present embodiment. The manufacturing procedure will be described as follows with reference to these drawings. First, the processes shown in FIG. 4 will be described as follows.

(1) In the same manner as in Embodiment 1, the polysilicon layer 21, which is poly-crystallized and isolated from each other just like islands in the predetermined pattern, is formed on the glass substrate 1. Then, the gate insulator film 3 and the metal layer 48 made of Al, Mo, Ta or the like, which is to be the gate electrode, are formed in this order in such a manner as to cover the polysilicon layer.

(2) Two different positive photo resist layers of a top-layer photo resist 83 solidified at lower postbaking temperatures of 120° C. and a bottom-layer photo resist 84 solidified at higher postbaking temperatures of 150° C., for example, are applied on the metal layer 48.

(3) Exposure is performed by using a photomask 9 for forming the gate electrode, and photolithography is applied to the top- and bottom-layer photo resists 83 and 84 at the same time.

(4) After the two-layer photo resists 83, 84 are developed, postbaking is conducted at 150° C. at which the bottom-layer photo resist 83 is solidified. As a result, the bottom-layer photo resist 83 is solidified while keeping its shape, but the top-layer photo resist 84, which is solidified at a lower temperature of 120° C., heat shrinks at 150° C. and has taper angles at tilted side surfaces fanning out downwardly. Thus, the top-layer photo resist 844 has a cross section of a trapezoid with a short top side.

(5) The metal layer 48 is etched by using the top- and bottom-layer photo resists as a mask to form the provisional gate electrode 4, then the first injection of impurities is conducted by ion doping with phosphorous ions while using this gate electrode as a mask. Here, concentration of impurities is set to be higher. As a result, the region of the polysilicon layer that is directly below the provisional gate electrode 4 is not doped with the impurities. The other regions of the polysilicon layer are heavily doped with impurities, and become the source region 25 and the drain region 26, respectively.

The following description is based on FIG. 5.

(6) The top- and bottom-layer photo resists 834 and 844 on the gate electrode 4 are etched, for example, by means of ashing with $O_2$ and ozone so as to be reduced in size equally in length and its ends to be moved toward the center, thereby exposing the surfaces of both ends of the provisional gate electrode 4 in the channel direction. The amount of exposure in both ends of the provisional gate electrode 4 is set at about 0.2-0.5 μm when the gate electrode 4 has a width of 2 μm.

(7) These ends of the provisional gate electrode 4 that are exposed from the top- and bottom-layer photo resists 834 and 844 are removed by etching. As a result, the provisional gate electrode 4 is processed into the gate electrode 41 at this stage.

(8) The second injection of impurities is conducted by ion doping with phosphorus ions while using the gate electrode 41 as a mask in the same manner as the first injection.

The impurities are injected in lower concentration than in the first injection. As a result, low-concentration impurities are implanted into the regions 245 and 246 of polysilicon layer both are directly below each end of the gate electrode in the channel direction which have been removed by etching. Consequently, low-concentration impurity-doped regions (n– layers) are formed in the same minuscule width as the etched areas of the provisional gate electrode 4 on opposite sides of the channel region of the polysilicon layer. Hence, an LDD structure is composed by the channel region 24 not doped with impurities which is directly below the gate electrode 4, low-concentration impurity regions (n– layers) 245 and 246, and the source and drain regions 25 and 26 on opposite sides of the regions.

(9) After the top- and bottom-layer photo resists 834, 844 are removed, an interlayer insulator film (made of $SiO_x$ or the like) 7 is so formed as to cover the gate electrode 4.

Next, the interlayer insulator film 7 and the gate insulator film 3 are provided with contact holes for source and drain electrode formation. A metal layer made of Al or the like is formed by sputtering onto the surface of the substrate. As a result, Al or the like is filled into these contact holes. The obtained metal layer is patterned into a predetermined shape to form a source electrode 5 and a drain electrode 6. Finally, a protective film 88 made of SiN or other materials is formed to complete the thin film transistor.

Embodiment 3

In the present embodiment, a single-layer photo resist is used to etch the gate electrode which functions as a doping mask in fabricating an LDD structure, and that various ideas are put into prebaking.

Figure 6:
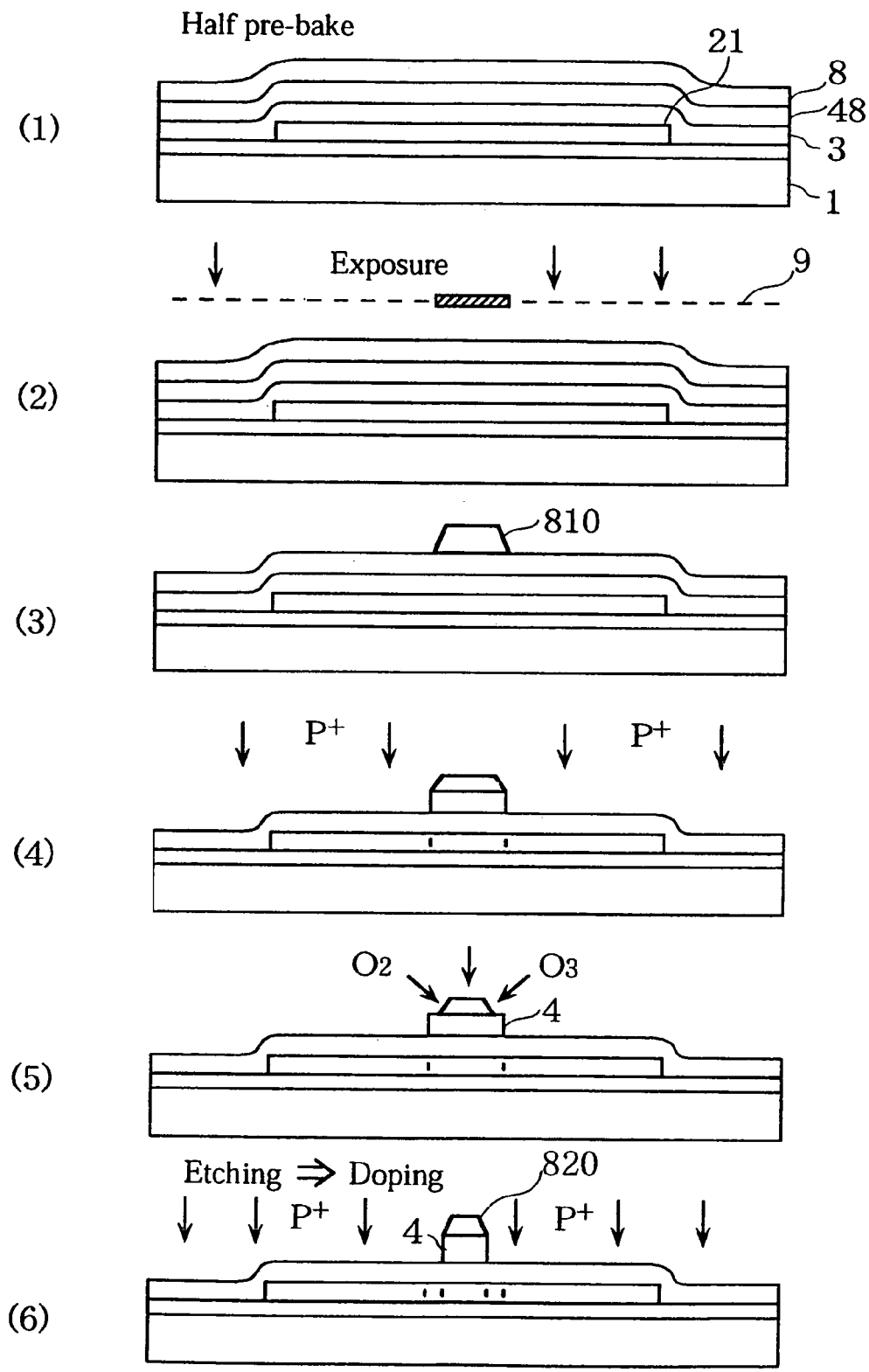
FIG. 6 shows the cross sections of the processes in the method of fabricating the thin film transistor of Embodiment 3 of the present invention.

FIG. 6 shows the processes in the method of fabricating the thin film transistor of the present embodiment. The procedure of the method will be described as follows with reference to this figure.

(1) In the same manner as in Embodiments 1 and 2, the polysilicon layer 21, which is poly-crystallized by laser annealing, is formed in a predetermined pattern on a glass substrate 1. Then, a gate insulator film 3 and a metal layer 48 made of Al, Mo, Ta or the like are formed in this order in such a manner as to cover the polysilicon layer 21. A single-layer positive photo resist 8 is applied on the metal layer 48. The photo resist 8 is prebaked at lower temperatures than its prebaking temperatures. That is, the photo resist 8 has predetermined prebaking temperatures of 70-80° C., but the prebaking is done at 10-25° C. lower temperatures. As a result, the photo resist 8 becomes less resistant to the developing solution used in the subsequent development.

(2) Exposure is performed by using a photomask 9 for gate electrode formation, and the exposed regions of the photo resist 8 are removed by photolithography. After the exposure, development is conducted by using a predetermined developing solution (not shown).

(3) The photo resist 8 has become less resistant to the developing solution as mentioned above. Therefore, the side surfaces of the ends of the photo resist 8 that have not been subjected to exposure suffer from significant erosion, resulting the side surfaces of the remaining photo resist 810 each having a tapered angle and making the cross section of the resist 810 a trapezoid fanning out downwardly to be formed a forward taper.

(4) The metal layer 48 is etched while using the photo resist as a mask, thereby forming a provisional gate electrode 4. While using the provisional gate electrode 4 as a mask, a first injection of impurities is conducted by ion doping with phosphorus ions. The impurities are injected in high concentrations. Hence, the channel region of the polysilicon layer that is directly below the provisional gate electrode 4 is not doped with impurities at all, whereas the source region and the drain region on opposite sides in the channel direction are heavily doped with impurities.

(5) The photo resists 820 is etched, for example, by means of ashing with $O_2$ and $O_3$ so as to be reduced in size equally in length and its ends to be moved toward the center, thereby exposing the top surfaces of both ends of the provisional gate electrode 4 in the channel direction. The amount of exposure in both ends of the provisional gate electrode 4 is set at the same as in the embodiments mentioned above.

(6) These ends of the gate electrode that are exposed from the photo resist 820 are removed by etching. Then, the second injection of impurities is conducted while using as a mask the gate electrode 41 and also the overlying photo resist, to be more exact.

The impurities are injected by ion doping as in the first injection; however, the impurities are injected in lower concentrations than the first injection.

As a result, the polysilicon layer with the LDD structure can be obtained as in the embodiments mentioned above.

Hereafter, the same procedure as in Embodiments 1 and 2 is conducted to complete a thin film transistor.

Embodiment 4

The present embodiment is equal to Embodiment 3 in using a single-layer photo resist, but greatly differs in the practice of exposure and using a negative photo resist.

Figure 7:
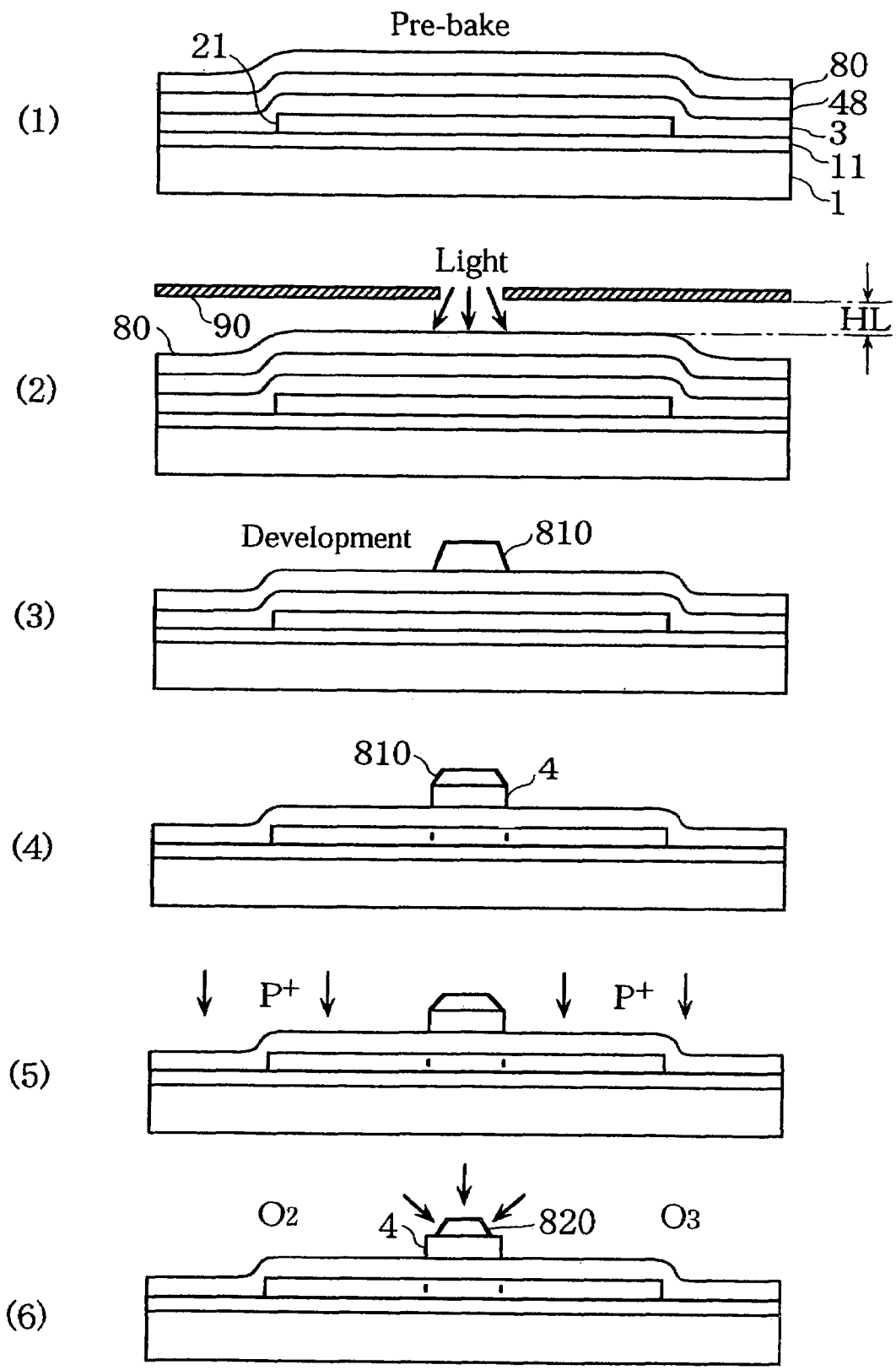
FIG. 7 shows the cross sections of the processes in the method of fabricating the thin film transistor of Embodiment 4 of the present invention.

FIG. 7 shows the processes in the method of fabricating the thin film transistor of the present embodiment. The procedure of the method will be described as follows with reference to FIG. 7.

(1) In the same manner as in Embodiments 1-3, the polysilicon layer 21, which is poly-crystallized by laser annealing and isolated from each other in a predetermined pattern, is formed on a glass substrate 1. Then, a gate insulator film 3 and a metal layer 48 made of Al, Mo, Ta or the like are formed in this order in such a manner as to cover the polysilicon layer. After this, unlike in Embodiment 3, a negative photo resist 80 is applied to be thicker (3-6 μm, for example) than the normal thickness (1-2 μm) thereon. The applied photo resist is prebaked as predetermined.

(2) In order to form a gate electrode, exposure is conducted with a photomask 90 of perforated pattern, and photolithography is applied to the negative photo resist. In this case, the spacing HL between the top surface of the negative photo resist 80 on the glass substrate 1 and the photomask 90 is made large enough to defocus the focus point on the photo resist, thereby broadening the light applied for exposure. As a result, this photo resist is exposed not with parallel rays of light but with rays of light that broaden from a hole of the mask. In this case, light diffraction due to the minuscule hole accelerates the broadening of light.

(3) The photo resist is developed and patterned in accordance with the gate electrode. Since exposure is carried out with rays of light broadening from the hole of the mask, the side surfaces of the remaining photo resist 810 each have a tapered angle, making the resist 810 have a nearly tapered cross section.

(4) The metal layer 48 is etched while using the photo resist 810 as a mask, thereby forming a provisional gate electrode 4.

(5) While using this provisional gate electrode 4 as a mask, the first injection of impurities is conducted by ion doping with phosphorus ions. The impurities are injected in high concentrations. Hence, the region of the polysilicon layer 21 that is directly below the provisional gate electrode 4 is not doped with the impurities at all, whereas the regions on opposite sides of the region in the channel direction are heavily doped with the impurities.

(6) The photo resists 820 is etched, for example, by means of ashing with $O_2$ and ozone equally in length so as to be reduced in size and its ends be moved toward the center, thereby exposing the surfaces of both ends of the provisional gate electrode 4.

Hereafter, the same procedure as in the embodiments mentioned above is conducted to complete a thin film transistor.

Embodiment 5

The present embodiment, which uses a single-layer resist the same as in the above two embodiments, is characterized in that the resist is a melt-type resist.

Figure 8:
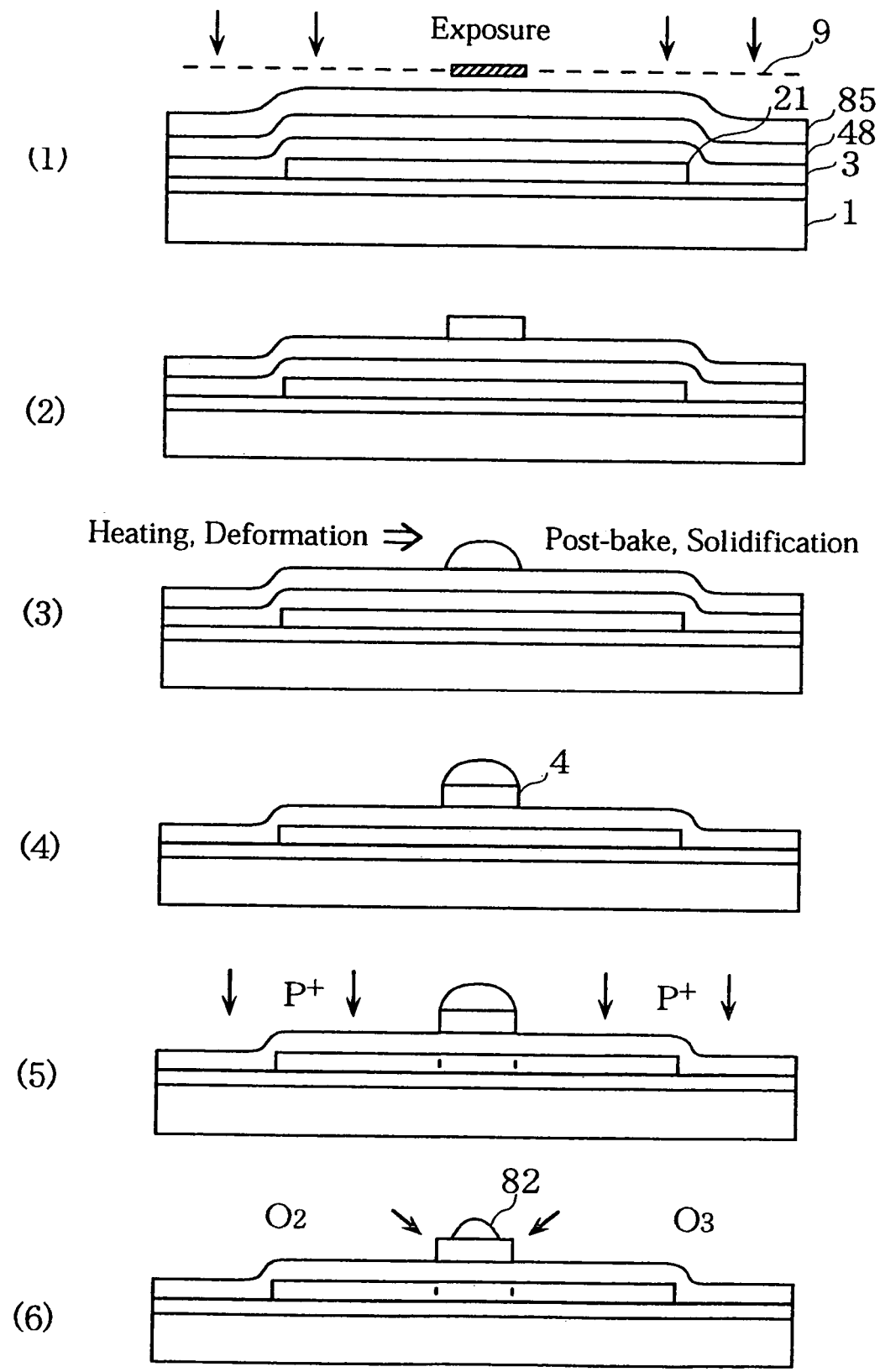
FIG. 8 shows the cross sections of the processes in the method of fabricating the thin film transistor of Embodiment 5 of the present invention.

FIG. 8 shows the processes in the method of fabricating the thin film transistor of the present embodiment. The procedure of the method will be described as follows with reference to the figure.

(1) In the same manner as in each embodiment mentioned above, a polysilicon layer 2, which is poly-crystallized and isolated from each other, is formed on a glass substrate 1. Then, a gate insulator film 3 and a metal layer 48 made of Al, Mo, Ta or the like are formed in this order in such a manner as to cover the polysilicon layer. Further applied on the metal layer 48 is a melt-type resist 85, which is photosensitive and melts (to be more exact, becomes the state between melting and softening because the material is polymer) at 120-200° C., and its pattern shape is considerably deformed by the effect of surface tension. As this melt-type resist, a melt flow resist mainly used for the formation of a micro lens of a CCD device element is used in the present embodiment. This resist easily melts at predetermined temperatures; in a melted state, the edges are rounded in its cross section as illustrated, and the surface not in contact with the gate electrode becomes semispherical.

Then, exposure is carried out with a photomask 9 for gate electrode formation.

(2) Photolithography is applied to the melt-type resist.

(3) A thermal treatment is applied to the melt-type resist 85 at 120-200° C. This melt-type resist deforms into a hemisphere on the metal layer 48 at the temperatures in the thermal treatment because of the above-mentioned reasons. Next, in order to maintain the shape obtained by melting and deforming, postbaking is performed at 200-250° C.

(4) The metal layer 48 is etched while using the melt-type resist as a mask, thereby forming a provisional gate electrode 4.

(5) The first injection of impurities is performed while using the provisional gate electrode 4 as a mask in the same manner as the above embodiments.

(6) In the same manner as in the above embodiments, the melt-type resist 82 is etched, for example, by means of ashing with $O_2$ and ozone so as to be reduced in size equally and its ends to be moved toward the center of the hemisphere, thereby exposing the surfaces of both ends of the gate electrode 4 in the channel direction.

Hereafter, the same procedure as in the above embodiments is conducted to complete a thin film transistor.

As a modified example of this embodiment, prior to the formation of the provisional gate electrode, at the stage where the resist is isolated from each other, the resist 85 can be exclusively formed into a hemisphere by being melted with heat.

Embodiment 6

In the present embodiment, heat shrinkage of a single-layer resist is employed.

Figure 9:
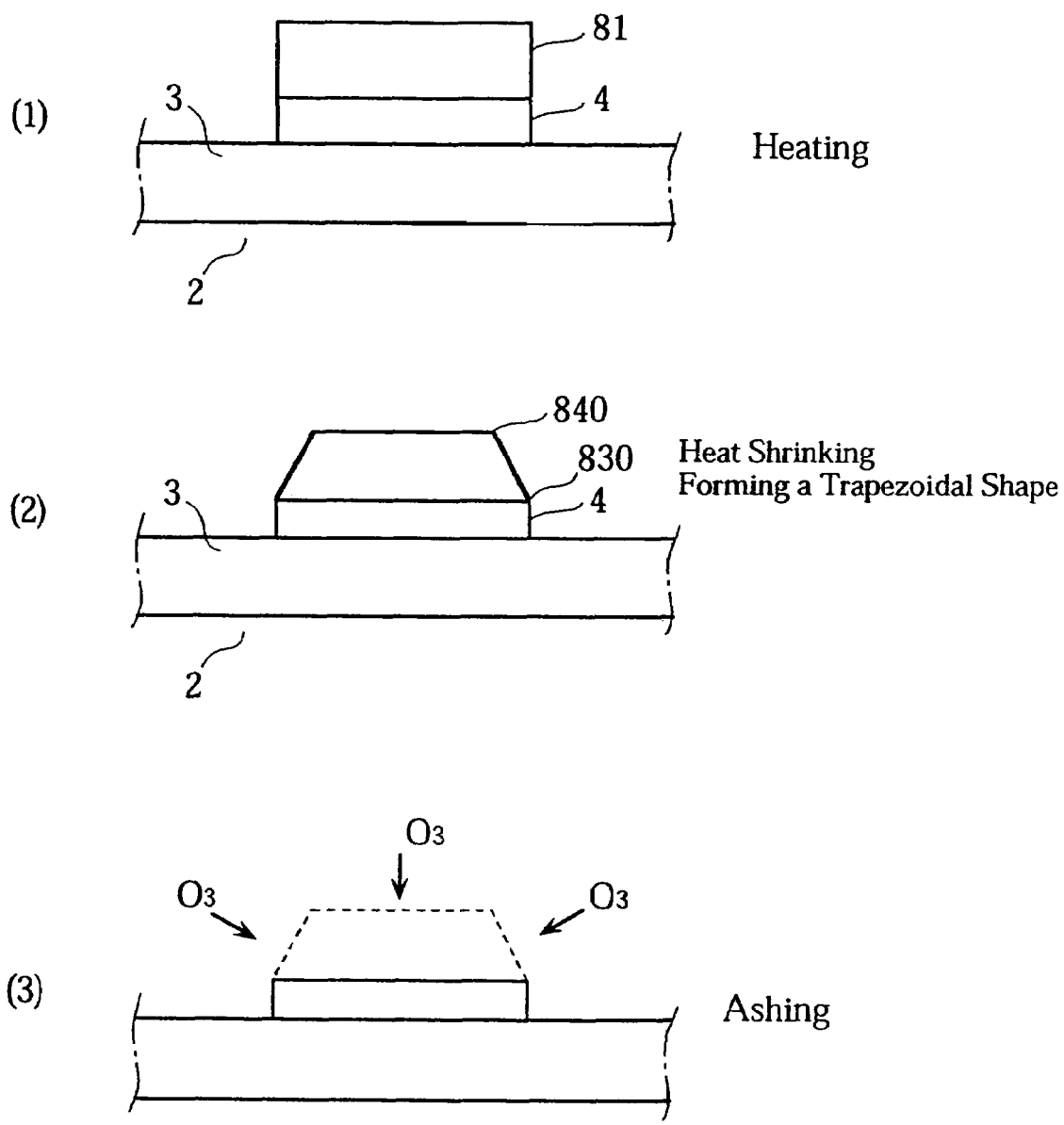
FIG. 9 shows the cross sections of the processes in the method of fabricating the thin film transistor of Embodiment 6 of the present invention.

FIG. 9 shows the main processes in the method of fabricating the thin film transistor of the present embodiment. The procedure of the method will be described as follows with reference to the figure.

(1) The whole substrate is exposed to high temperatures determined by the properties of a resist 81 under the conditions that isolated resist 81 exists on the provisional gate electrode 4.

(2) A top portion 840 of the resist 81 is heat shrunk, but a bottom portion 830 in contact with a provisional gate electrode 4 does not shrink due to the restriction of the provisional gate electrode, thereby the resist 81 has a trapezoidal cross section in the channel direction.

(3) Both ends of the resist in the channel direction are removed by ashing. The top portion high in density is less removed in length (or in thickness) than the bottom portion low in density, which has a stretching force and can be removed comparatively faster. This is convenient in removing both ends of the gate electrode by etching.

As a modified example of the present embodiment, prior to the patterning of the metal film for gate electrode formation, that is, at the stage where the resist is patterned or isolated from each other in accordance with the provisional gate electrode 4 to be formed, the resist can be heat shrunk to form a trapezoidal cross section in the channel direction.

Embodiment 7

The present embodiment is characterized in that the resist patterned for the formation of the provisional gate electrode has both ends tilted in the channel direction.

Figure 10:
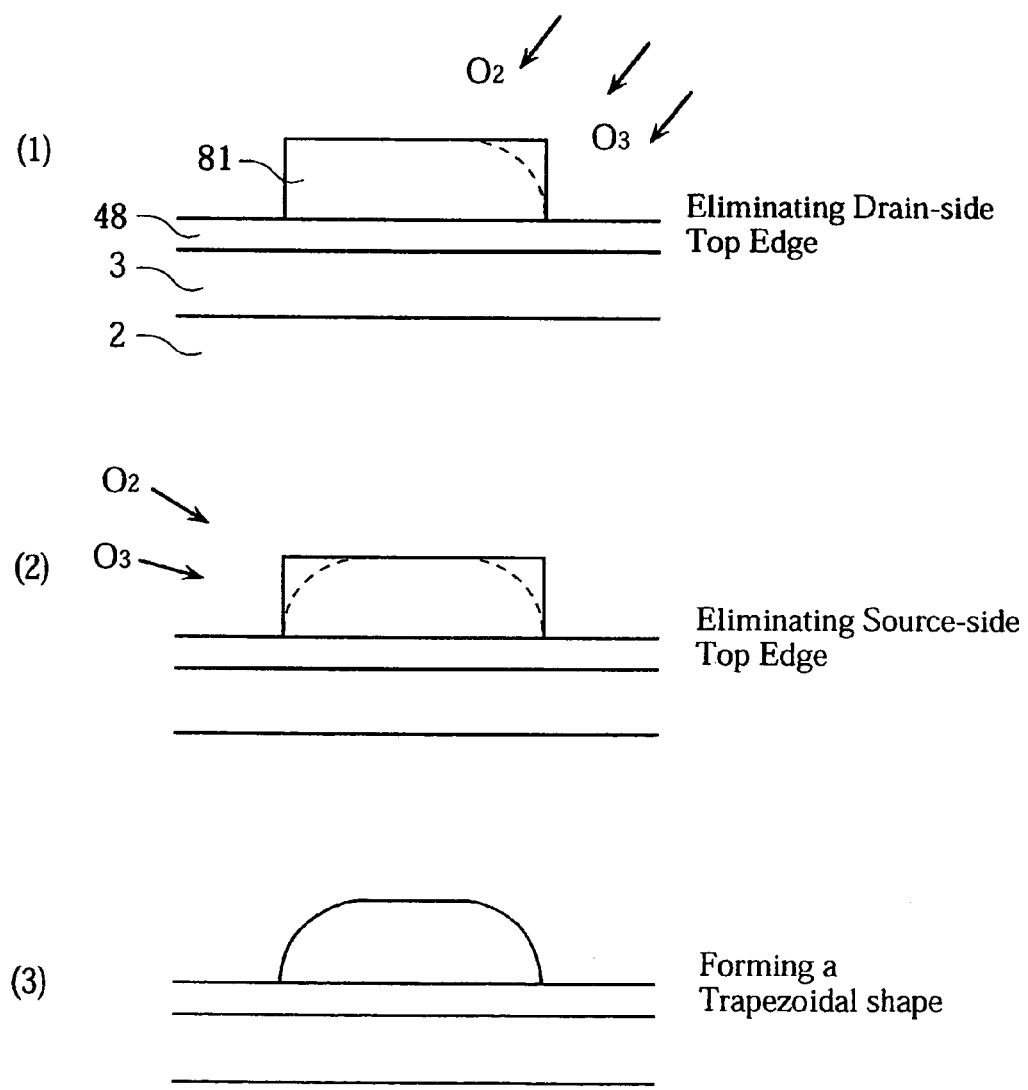
FIG. 10 shows the cross sections of the processes in the method of fabricating the thin film transistor of Embodiment 7 of the present invention.

FIG. 10 shows the main processes in the method of fabricating the thin film transistor of the present embodiment. The procedure of the method will be described as follows with reference to the figure.

(1) The top portion of a resist 81 on the drain side is exposed to either $O_2$ or $O_3$ to round the edges of the top portion on the drain side. The bottom portion which has accumulated gas and is in the shade of a neighboring resist, is hardly removed.

(2) The top portion thereof on the source side is exposed to either $O_2$ or $O_3$ to round the edges of the top portion on the source side.

(3) The corners of both ends of the resist 81 in the channel direction are removed to be shaped like a trapezoid whose bottom side is longer than the top side.

In the present embodiment, the patterned resist can be a little larger than the provisional gate electrode.

Embodiment 8

The present invention relates to an offset thin film transistor not having low-concentration impurity regions.

Figure 11:
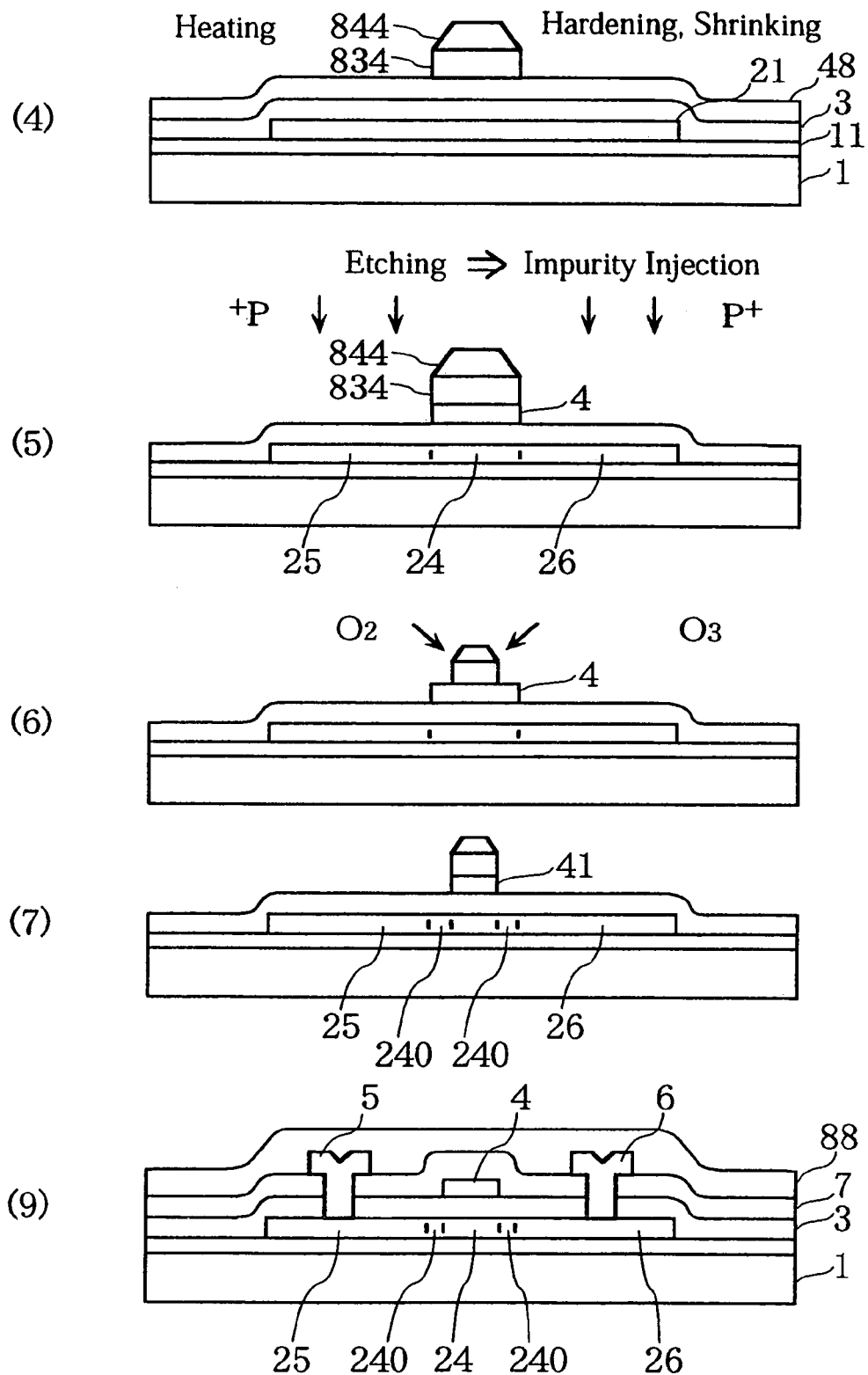
FIG. 11 shows the cross sections of the processes in the method of fabricating the thin film transistor of Embodiment 8 of the present invention.

FIG. 11 shows the processes in the method of fabricating the thin film transistor of the present embodiment. The procedure of the method will be described as follows with reference to the figure.

(1)-(3) Since these processes are the same as in Embodiment 2, illustrations are omitted. The polysilicon layer 21, which is poly-crystallized and has a predetermined shape, is formed on the glass substrate 1. Then, the gate insulator film 3 and the metal layer 48 made of Al, Mo, Ta or the like are formed in this order in such a manner as to cover the polysilicon layer 21.

After this, two kinds of positive photo resist layers which are solidified at different postbaking temperatures are applied on the metal layer 48. The top-layer photo resist solidifies at lower temperatures and the bottom-layer photo resist is solidified at higher temperatures. Exposure is performed while using a photomask for gate electrode formation, and photolithography is applied to the top- and bottom-layer photo resists.

(4) After the two-layer photo resists are developed, postbaking is conducted at 150° C. at which the bottom-layer photo resist 834 is solidified. As a result, the bottom-layer photo resist 834 is solidified while keeping its shape as shown in (4) of FIG. 4, but the top-layer photo resist 844 heat shrinks and its side surfaces are tapered. Consequently, the top-layer photo resist 844 has a trapezoidal cross section.

(5) The metal layer 48 is etched while using the top- and bottom-layer photo resists 834 and 844 as a mask to form the provisional gate electrode 4. While using the obtained provisional gate electrode 4 as a mask, the first injection of impurities is conducted in high concentrations.

(6) The top- and bottom-layer photo resists are etched, for example, by means of ashing with $O_2$ and ozone so as to be reduced in size equally in length and its ends to be removed toward the center, thereby exposing the surfaces of both ends of the provisional gate electrode 4 in the channel direction.

(7) These ends of the provisional gate electrode 4 that are exposed from the top- and bottom-layer photo resists are removed by etching. As a result, the channel region of the polysilicon layer 21 is slightly exsert to the neighboring regions 240 on opposite sides, thereby obtaining an offset channel region with regard to the gate electrode.

The offset thin film transistor does not have the process of the second impurity injection shown in FIG. 5 (8).

(9) After the top- and bottom-layer photo resists 834 and 844 are removed, an interlayer insulator film ($SiO_x$ or the like) 7 is so formed as to cover the gate electrode 4. Hereafter, the same procedure as in the above embodiment is conducted to complete an offset thin film transistor.

The present embodiment shows the method of fabricating the offset thin film transistor based on the above Embodiment 2; however, it goes without saying that this method can be applied to Embodiments 1, 3, 4, and 5 by omitting the second impurity injection.

Embodiment 9

The present invention relates to a bottom-gate thin film transistor.

Figure 12:
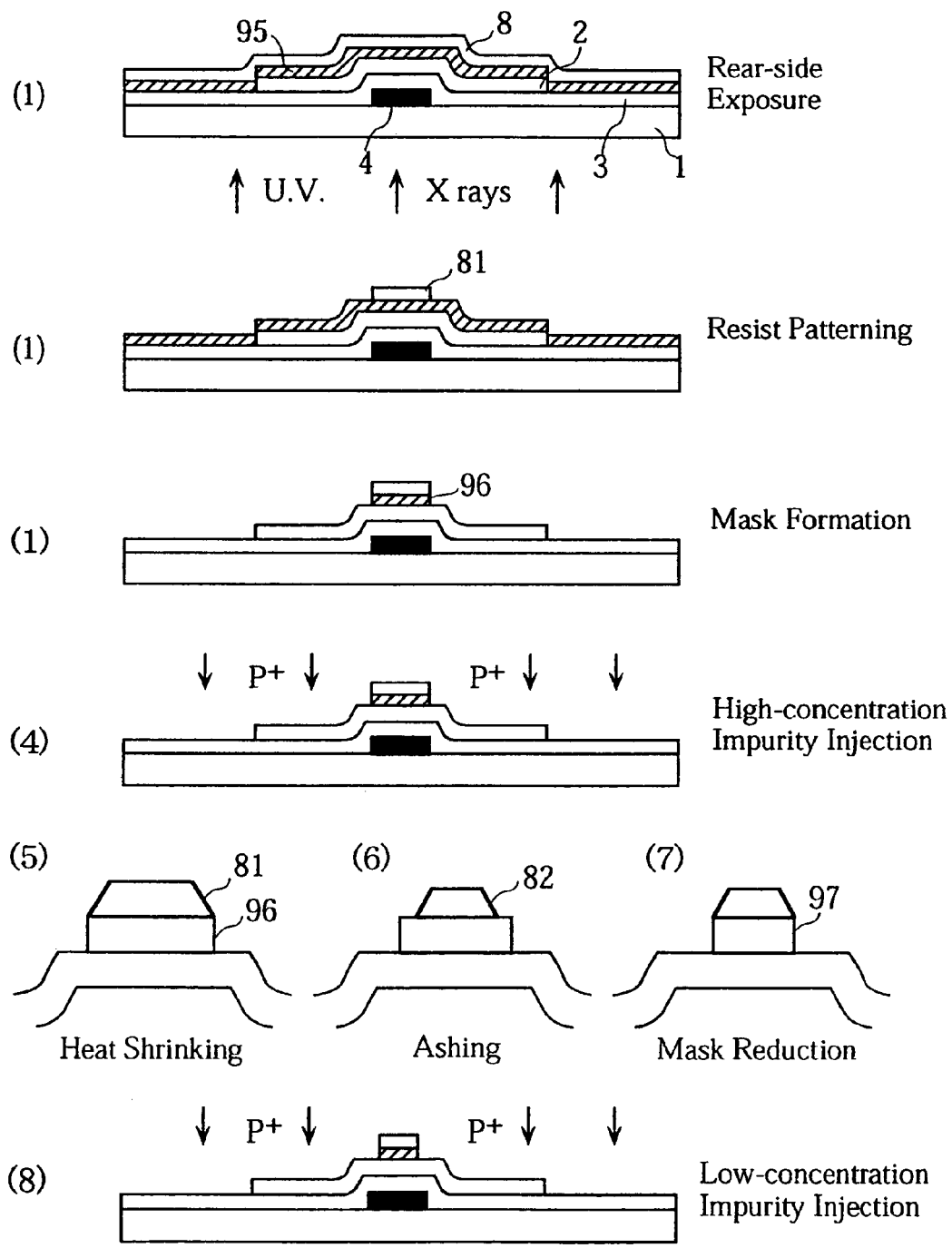
FIG. 12 shows the cross sections of the processes in the method of fabricating the thin film transistor of Embodiment 9 of the present invention.

FIG. 12 shows the processes in the method of fabricating the bottom-gate thin film transistor of the present embodiment. The procedure of the method will be described as follows with reference to the figure.

(1) A gate electrode 4 made of Ta, Mo, W, or an alloy these, a gate insulator film 3, a patterned polysilicon layer are formed in this order on a substrate 1, then a metal film 95 made of Ti or Al, which is to be a mask in injecting impurities, and a photo resist layer 8 are formed in this order further thereon. Under UV irradiation from the rear side of the substrate 1, the photo resist layer 8 is exposed while using the gate electrode 4 as a mask.

(2) A resist 81 patterned in accordance with the gate electrode 4 is formed.

(3) The metal film is dry-etched while using the resist 81 as a mask, thereby forming a metal mask 96 for impurity injection.

(4) High-concentration impurities are injected from the front (top) side of the substrate.

(5) The top portion of the resist is heat shrunk so that the side surfaces of the resist 81 in the channel direction have inclination.

(6) The side surfaces of the resist in the channel direction are moved to some amount towards the center by ashing.

(7) A metal mask 97 for forming LDD regions is formed.

(8) Impurities are injected in low concentrations.

Hereafter, a protective insulator film, a source electrode, a drain electrode, and other necessary components are formed.

Figure 13:
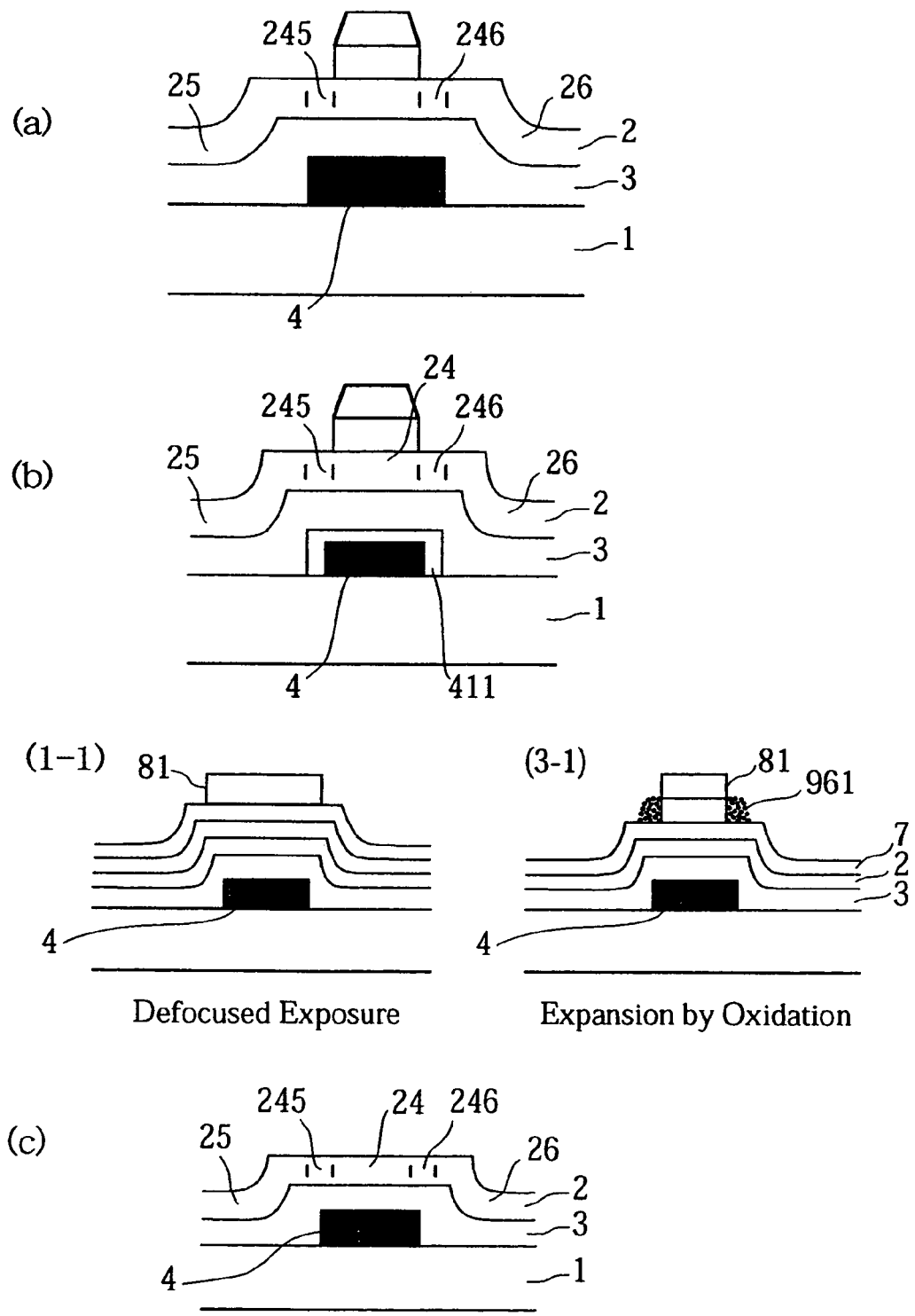
FIG. 13 shows the cross sections of the processes in the method of fabricating the thin film transistors of modified examples of Embodiment 9 of the present invention.

Next, a modified example of the present embodiment is shown in FIG. 13.

In FIG. 12, similar to that shown in FIG. 13(*a*), LDD regions 245 and 246 are formed directly above both ends of the gate electrode 4 in the channel direction.

In (*b*) of the figure, an insulating oxide film 411 is previously formed around the gate electrode by thermal oxidation, and the LDD regions 245 and 246 are formed directly above both ends of the gate electrode 4 in the channel direction.

In FIG. 12 (1), defocused exposure is conducted so that the patterned resist sticks a little towards both ends of the gate electrode 4 in the channel direction. Hence, the LDD regions 245 and 246 are formed as shown in FIG. 13(*c*).

Similarly, a metal 96 for a mask is oxidized as in FIG. 12 (3) and the oxidized parts 961 of the metal 96 project towards both ends of the gate electrode 4 in the channel direction as shown in FIG. 13(3-1), thereby forming the LDD regions 245 and 246 as shown in FIG. 13(*c*).

It is possible to form the metal layer for a mask and the resist layer after forming the protective insulator film 7 on the patterned polysilicon layer. FIGS. 13(1-1) and (3-1) show this case.

Embodiment 10

The present embodiment, which belongs to the second invention group and is equal to each embodiment of the first invention group in making use of a gate electrode as a mask at the time of impurity injection to fabricate an LDD thin film transistor, is characterized by making use of oxidation in order to process the gate electrode.

Figure 14:
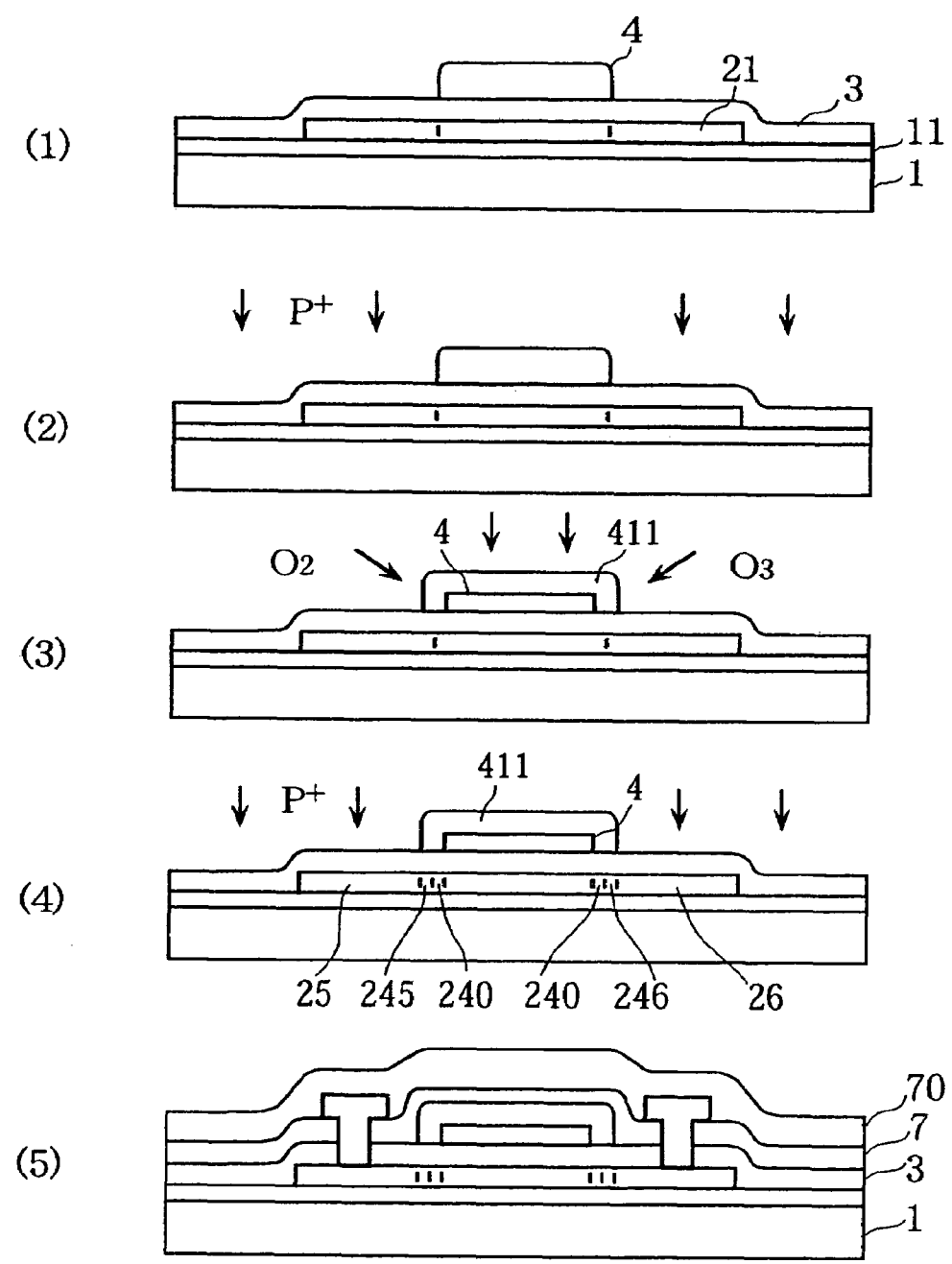
FIG. 14 shows the cross sections of the processes in the method of fabricating the thin film transistor of Embodiment 10 of the present invention.

FIG. 14 shows the processes in the method of fabricating an LDD thin film transistor of the present embodiment. The procedure of the method will be described as follows with reference to the figure.

(1) An $SiO_2$ film is applied as a buffer layer 11 on a glass substrate 1 in order to prevent the semiconductor silicon from migration of contaminated substances. An amorphous silicon having a thickness of 30-150 nm is formed on the top surface of the substrate 1 (#1737 glass manufactured by Corning Inc.), where the buffer layer was thus formed by decreased-pressure CVD with the use of silane ($SiH_4$) or the like as a source gas. Then, photolithography and etching are conducted to leave the amorphous silicon only in the regions where transistors as elements are to be formed. The left amorphous silicon is crystallized to form a polysilicon layer by XeCl excimer laser annealing. Then, $SiO_2$ which is to be a gate insulator film 3 is deposited as thick as 100 nm on the entire surface of the substrate by plasma CVD with the use of TEOS [Tetra Ethyl Ortho Silicate: $(C_2H_5O)_4Si$] as a source gas. After this, a provisional gate electrode 4 is formed to have a thickness of 400 nm by using a Mo—W alloy (W content of 15 atom %) or the like. The W content, which is set at 15% in this case, can be others, depending on the process or the designing components such as resistance value. (This embodiment so far basically therefore equals to each embodiment of the first invention group except for the various treatments applied to the two-layer or melt-type photo resists.)

(2) Hydrogen-diluted phosphine ($PH_3$) plasmas are generated while using the provisional gate electrode 4 as a mask, and ions are doped in low concentrations of a total dose amount of $2\times10^{13}$ $cm^2$ at an accelerating voltage of 70 kV, without mass separation. As a result, impurities are injected in low concentrations into the other regions of the polysilicon layer than the region directly below the gate mask 4 thereby low concentration impurity-doped regions (lightly doped drain) at both ends of the polysilicon layer in the channel direction.

(3) An oxide film is grown on the surface of the Mo—W alloy in oxygen of 450° C. or so. In this case, even if the oxide film has minuscule thickness, it can be precisely controlled by the time, temperature, atmosphere (oxygen concentrations), or a combination of these. In the present embodiment, the insulating oxide film 411 is grown to 0.4 μm. The remaining Mo—W alloy 4 film is about 200 nm.

(4) Hydrogen-diluted phosphine ($PH_3$) plasmas are generated, and then doped in high concentrations of a total dose amount of $1\times10^{15}$ $cm^2$ at an accelerating voltage of 70 kV, without mass separation on the polysilicon layer 21 while using the metal oxide film 411 and the remaining Mo—W alloy 4 as a mask. Consequently, a source region 25 and a drain region 26 are formed at both ends of the polysilicon layer in the channel direction. The injected ions can activated by the self activation of hydrogen injected together; however, it is more secure to conduct local heating by annealing at not lower than 400° C., excimer laser radiation, or RTA (Rapid Thermal Anneal).

Since the oxide film is also formed into the inner side in the channel direction, the inner side of the intermediate areas between both ends of the provisional gate electrode and the corresponding ends of the gate electrode become offset regions.

(5) Similar to each embodiment of the above embodiment, $SiO_2$ is deposited as an interlayer insulator film 7 on the entire surface of the substrate by plasma CVD with the use of TEOS [Tetra Ethyl Ortho Silicate: $(C_2H_5O)_4Si$] as a source gas, contact holes are formed, a metal such as Al is deposited by sputtering to form a source and a drain electrode, then the obtained metal layer is patterned by photolithography and etching. A protective insulator film 70 is provided if necessary. Hence, a poly-Si TFT is completed.

In the present embodiment, since the oxide film 411 actually grows into the inner side, there are more offset regions not doped with impurities in addition to (inside) the LDD regions. These offset regions not doped with impurities can be considered to have little amount of impurities in a broad sense. Therefore, in the present embodiment, these offset regions are treated as LDD regions.

Figure 15:
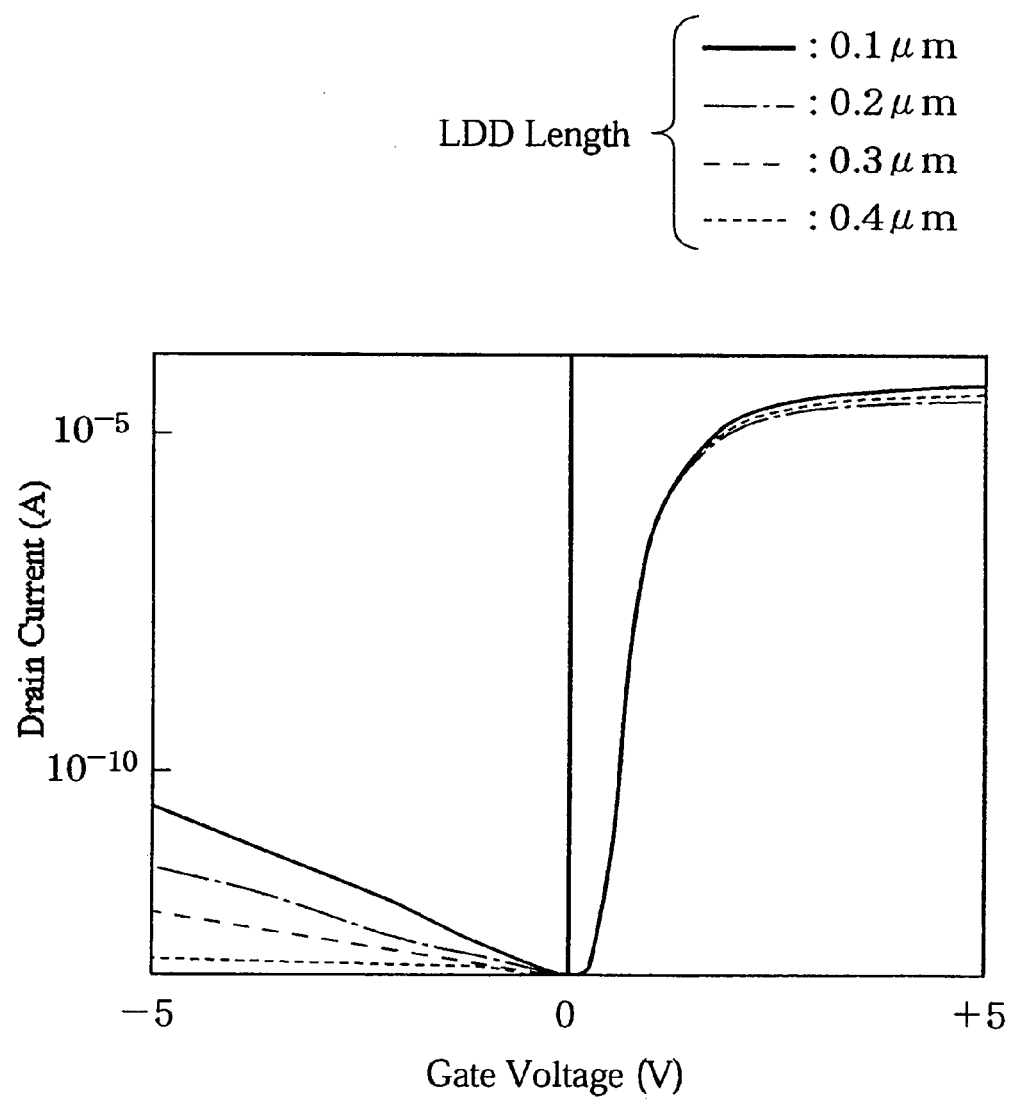
FIG. 15 shows the dependency of the drain current on the gate voltage in the thin film transistor of Embodiment 10.

FIG. 15 shows the dependence of the drain current on the gate voltage in the completed TFT at different LDD lengths. This diagram indicates that the OFF current is decreased by the thickness of the oxide film, thereby showing excellent TFT properties in each LDD length of 0.1 μm (solid line), 0.2 μm (chain line), 0.3 μm (long broken line), and 0.4 μm (broken line).

Embodiment 11

The present embodiment is similar to the above embodiment, but the metal oxide film once formed is removed.

Figure 16:
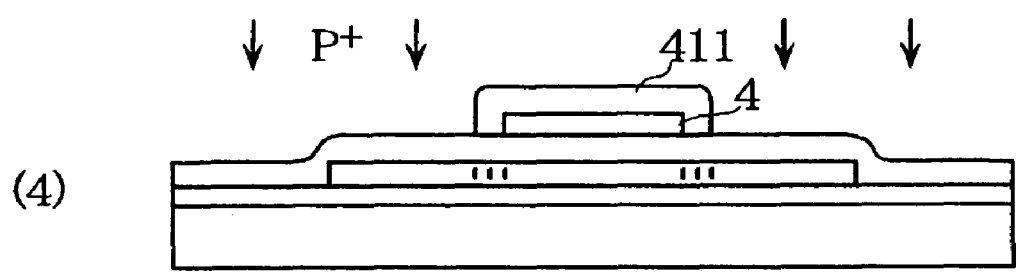
FIG. 16 shows the cross sections of the processes in the method of fabricating the thin film transistor of Embodiment 11 of the present invention.
Figure 16:
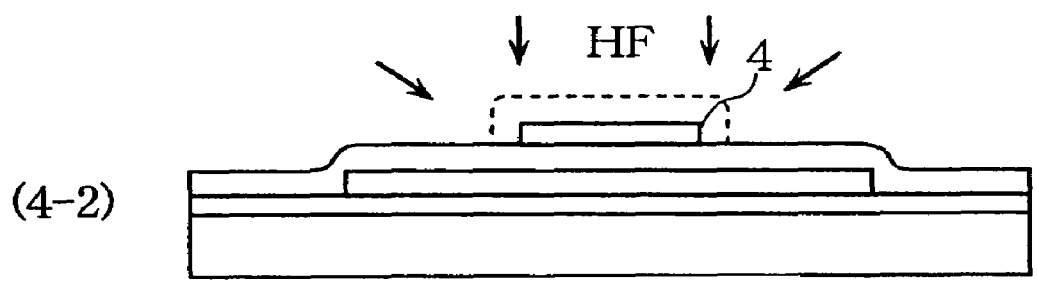
Figure 16:
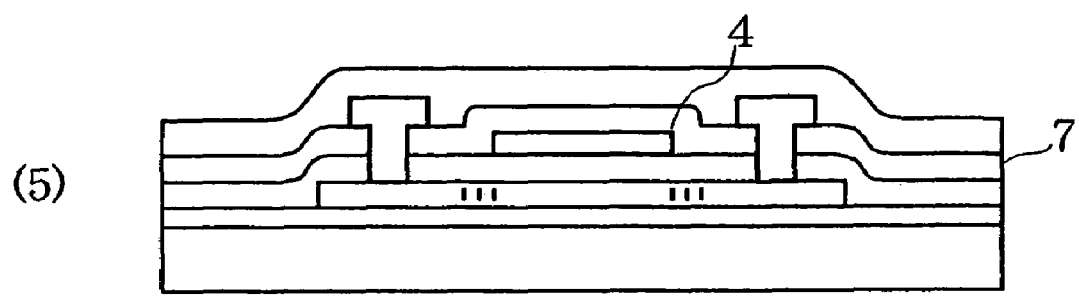

FIG. 16 shows the main processes in the method of fabricating a thin film transistor of the present embodiment. The procedure of the method will be described as follows with reference to the figure.

The procedures from (1) to (4) are equal to those in Embodiment 10 shown in FIG. 14. Therefore, only (4) which helps to understand the subsequent treatments is illustrated.

(4-2) After (4), the Mo—W oxide around the gate electrode 4 is removed by using fluoric acid.

(5) The subsequent treatments are equal to those in Embodiment 7.

Figure 17:
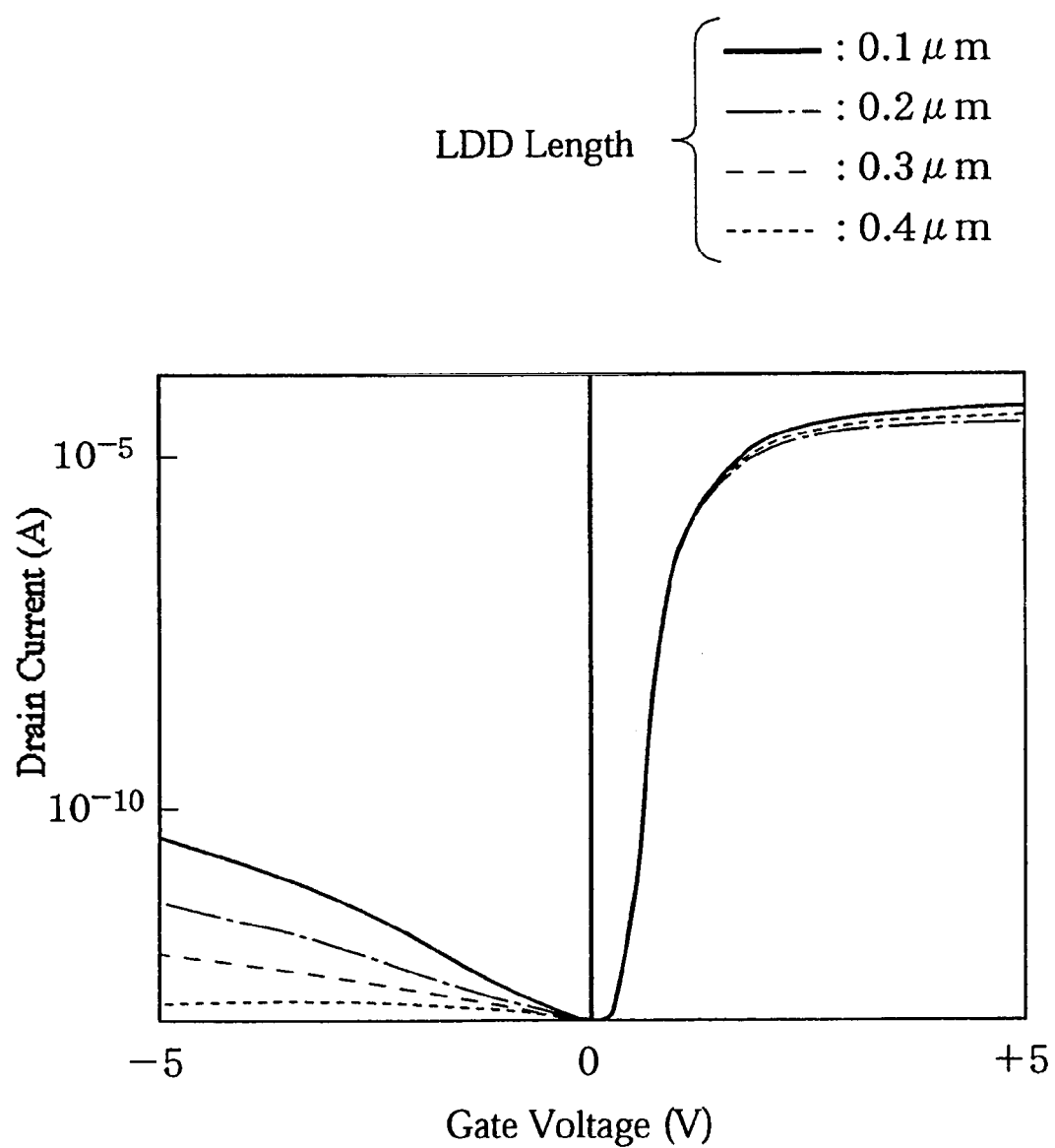
FIG. 17 shows the dependency of the drain current on the gate voltage in the thin film transistor of Embodiment 11.

FIG. 17 shows the dependence of the drain current on the gate voltage in the TFT completed in a similar manner to Embodiment 7 at different LDD lengths. This diagram indicates that the OFF current is decreased by the thickness of the oxide film, thereby showing excellent TFT properties in each LDD length of 0.1 μm, 0.2 μm, 0.3 μm, and 0.4 μm.

As a modified example of the present embodiment, the following order is possible: the gate electrode is oxidized first, impurities are injected in high concentrations, the oxide is removed, and impurities are injected in low concentrations.

Embodiment 12

The present embodiment differs from the above two Embodiments in that the oxidized gate metal is reduced.

Figure 18:
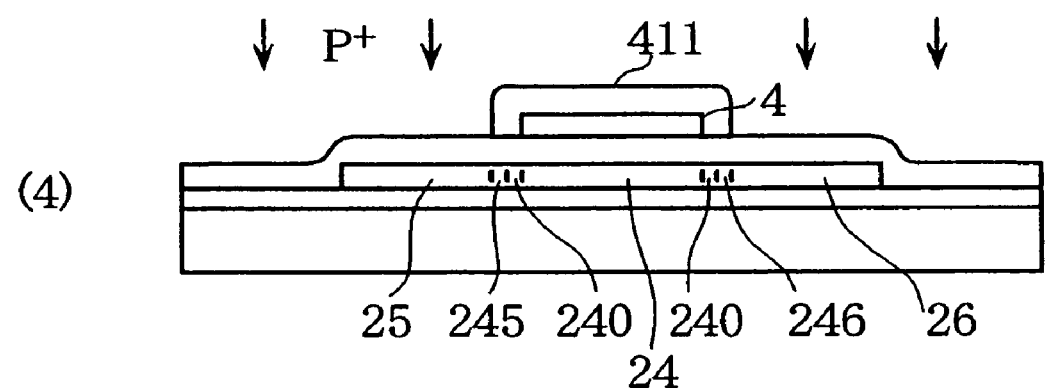
FIG. 18 shows the cross sections of the processes in the method of fabricating the thin film transistor of Embodiment 12 of the present invention.
Figure 18:
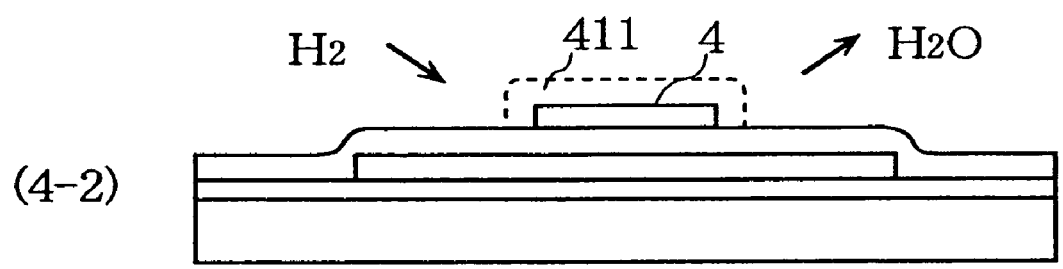
Figure 18:
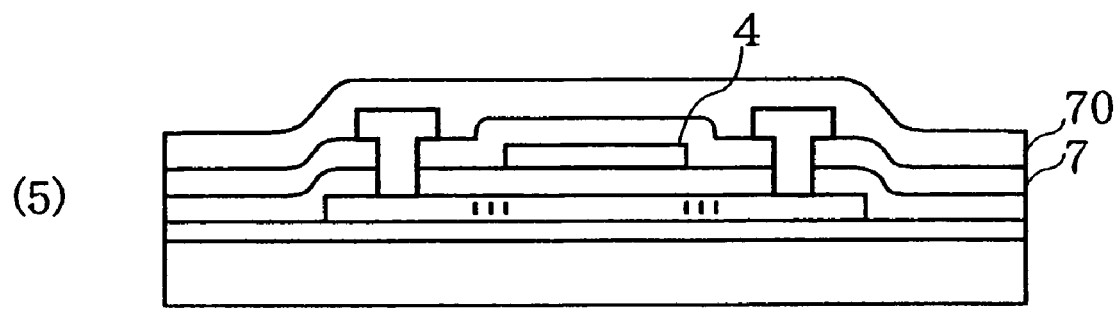

FIG. 18 shows the processes in the method of fabricating the thin film transistor of the present embodiment. The procedure of the method will be described as follows with reference to the figure.

(1) to (4) The same procedures as in the above two embodiments are conducted. Only the state of (4) in FIG. 14 is shown.

(4-3) After the process of (4), the oxidized metal is reduced in the atmosphere of $H_2$. As a result, unlike the above two embodiments where offset regions are formed, the Mo—W oxide is reduced to remove the offset in the present embodiment, thereby forming LDD regions in a narrow sense.

(5) The same procedures as in the above two embodiments are conducted to complete a TFT.

Figure 19:
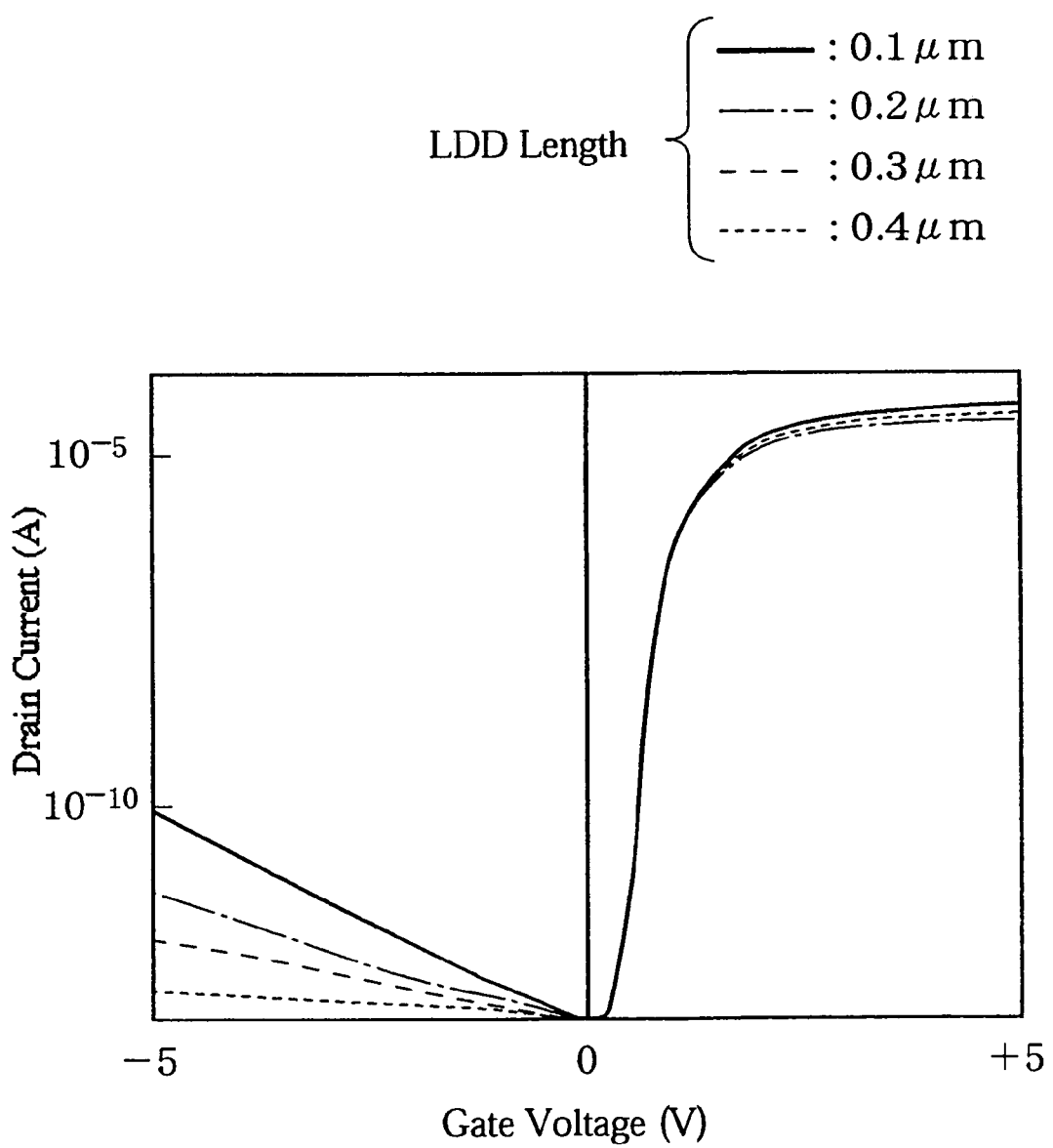
FIG. 19 shows the dependency of the drain current on the gate voltage in the thin film transistor of Embodiment 12.

FIG. 19 shows the dependence of the drain current on the gate voltage in the completed TFT at LDD lengths of 0.1 μm, 0.2 μm, 0.3 μm, and 0.4 μm. This diagram indicates that the OFF current is decreased by the thickness of the oxide film, thereby showing excellent TFT properties. Unlike Embodiments 10 and 11 where offset regions are formed, the Mo—W oxide is reduced to remove the offset in the present embodiment, thereby lessening a decrease in ON current than in Embodiments 10 and 11.

Embodiment 13

The present embodiment relates to an offset thin film transistor.

Figure 20:
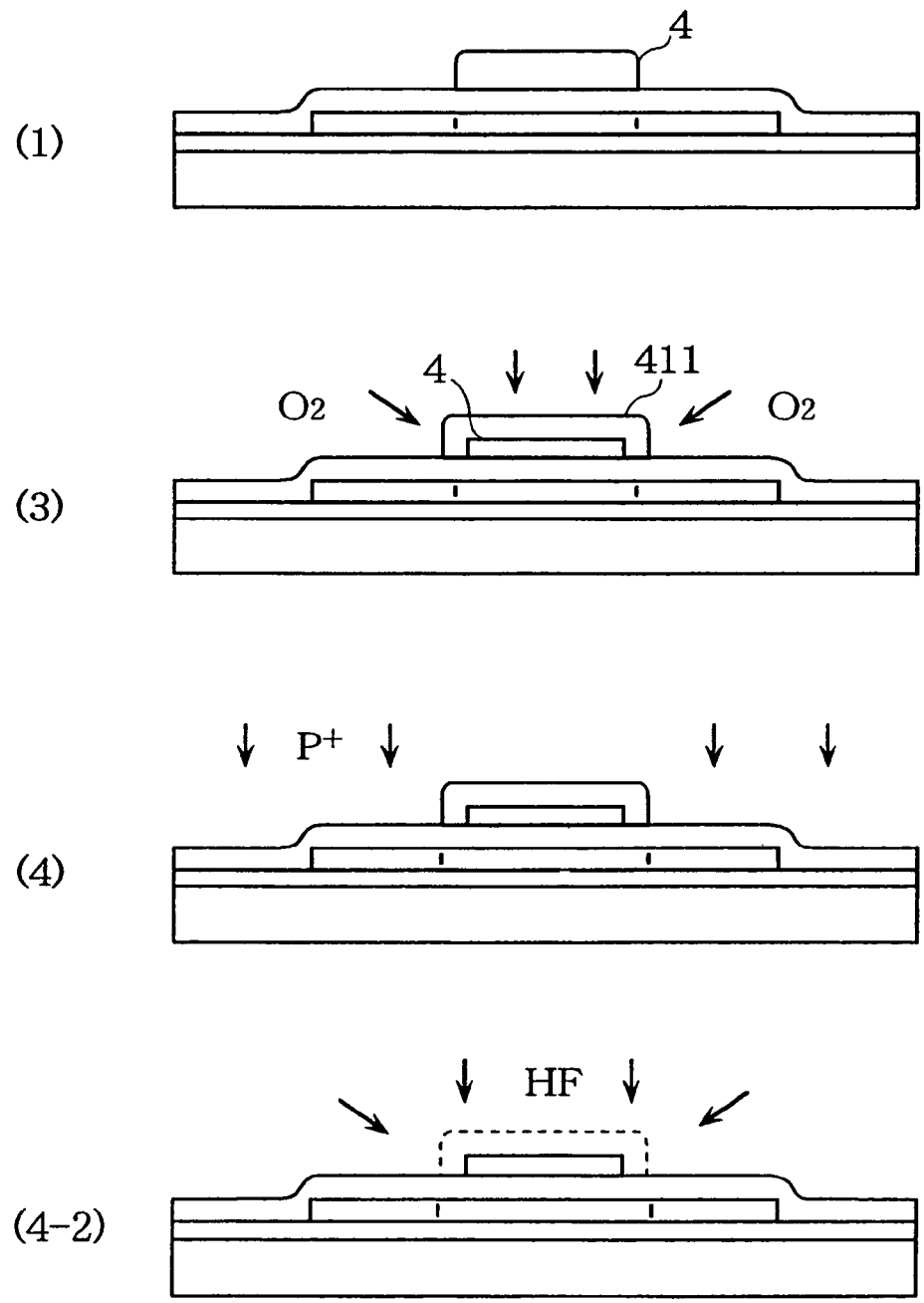
FIG. 20 shows the cross sections of the processes in the method of fabricating the thin film transistor of Embodiment 13 of the present invention.

FIG. 20 shows the processes in the method of fabricating the thin film transistor of the present embodiment. The procedure of the method will be described as follows with reference to the figure.

(1) A provisional gate electrode 4 is formed.

(2) An oxide film 411 is formed in the outer regions of the provisional gate electrode.

(4) Impurities are injected in high concentrations under the conditions that the oxide film is formed by a predetermined amount on the gate electrode.

(4-2) The oxide film is removed.

The subsequent procedures are the same as in the aforementioned embodiments.

Embodiment 14

The present embodiment is characterized by injecting impurities from diagonally above.

Figure 21:
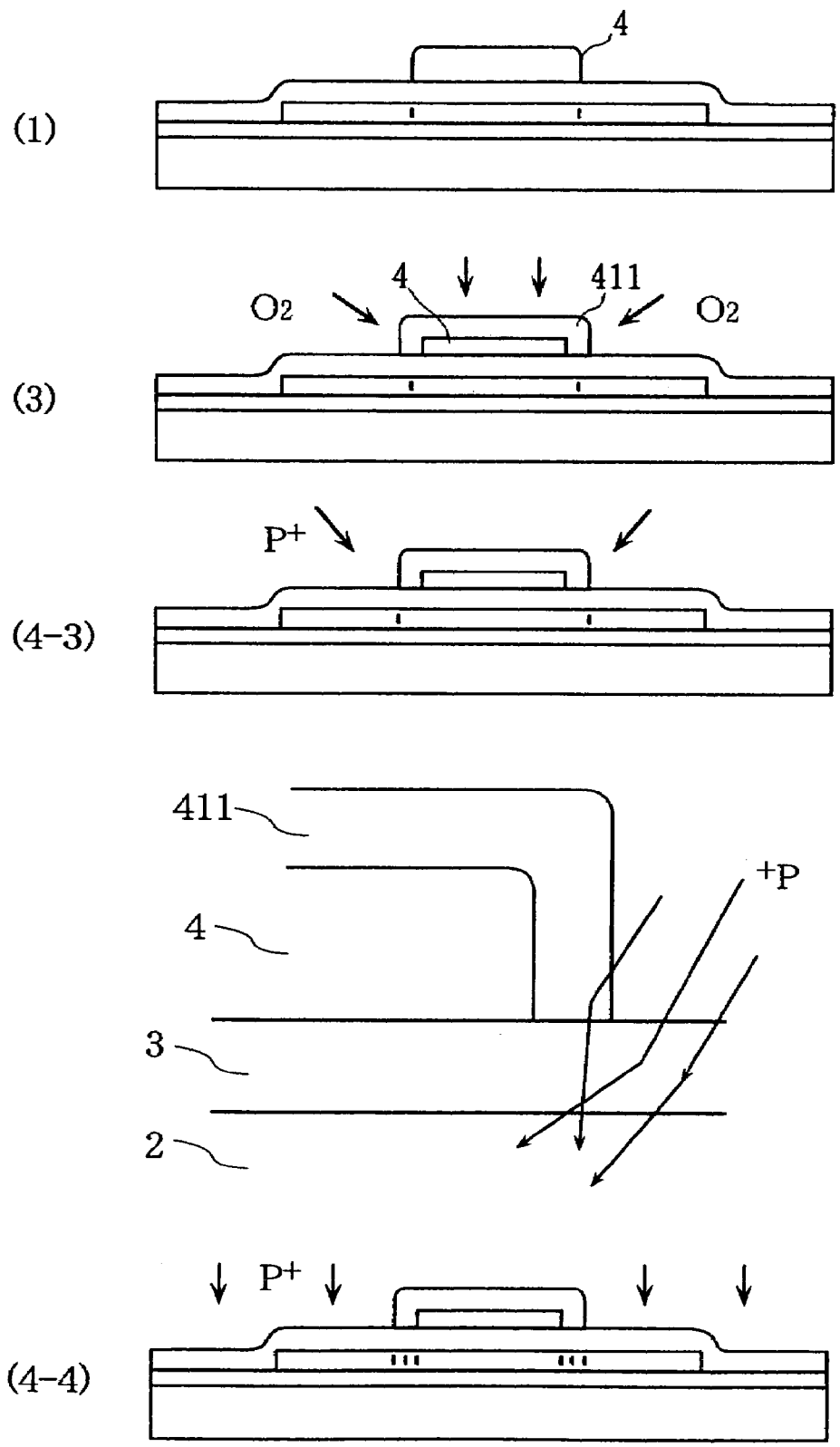
FIG. 21 shows the cross sections of the processes in the method of fabricating the thin film transistor of Embodiment 14 of the present invention.

FIG. 21 shows the cross sections of the processes in the method of fabricating the thin film transistor of the present embodiment. The procedure of the method will be described as follows with reference to the figure.

(1) A provisional gate electrode 4 is formed.

(2) An oxide film 411 is formed in the outer regions of the provisional gate electrode.

(4-3) Impurities are injected from diagonally above at comparatively high voltages and in predetermined concentrations under the conditions that the oxide film is formed by a predetermined amount on the gate electrode.

In this case, the impurities having a high energy multiply collide with atoms and molecules in the gate insulator layer or those at the lower-ends of the metal oxide on the side surfaces of the gate insulator film 3 of the gate electrode 4 until those stop, and intrude into the regions of the polysilicon layer 2 that are directly below the oxide metal due to scattering. This is also caused by implanting the impurities from diagonally above. As a result, LDD regions are formed. This is shown in the bottom of (4-3).

(4-4) Impurities are injected in high concentrations.

The subsequent procedures are the same as in the aforementioned embodiments. The oxide film 411 is removed if necessary.

Embodiment 15

The present embodiment also utilizes scattering as in the above embodiment. However, the impurities are injected exclusively from above.

Figure 22:
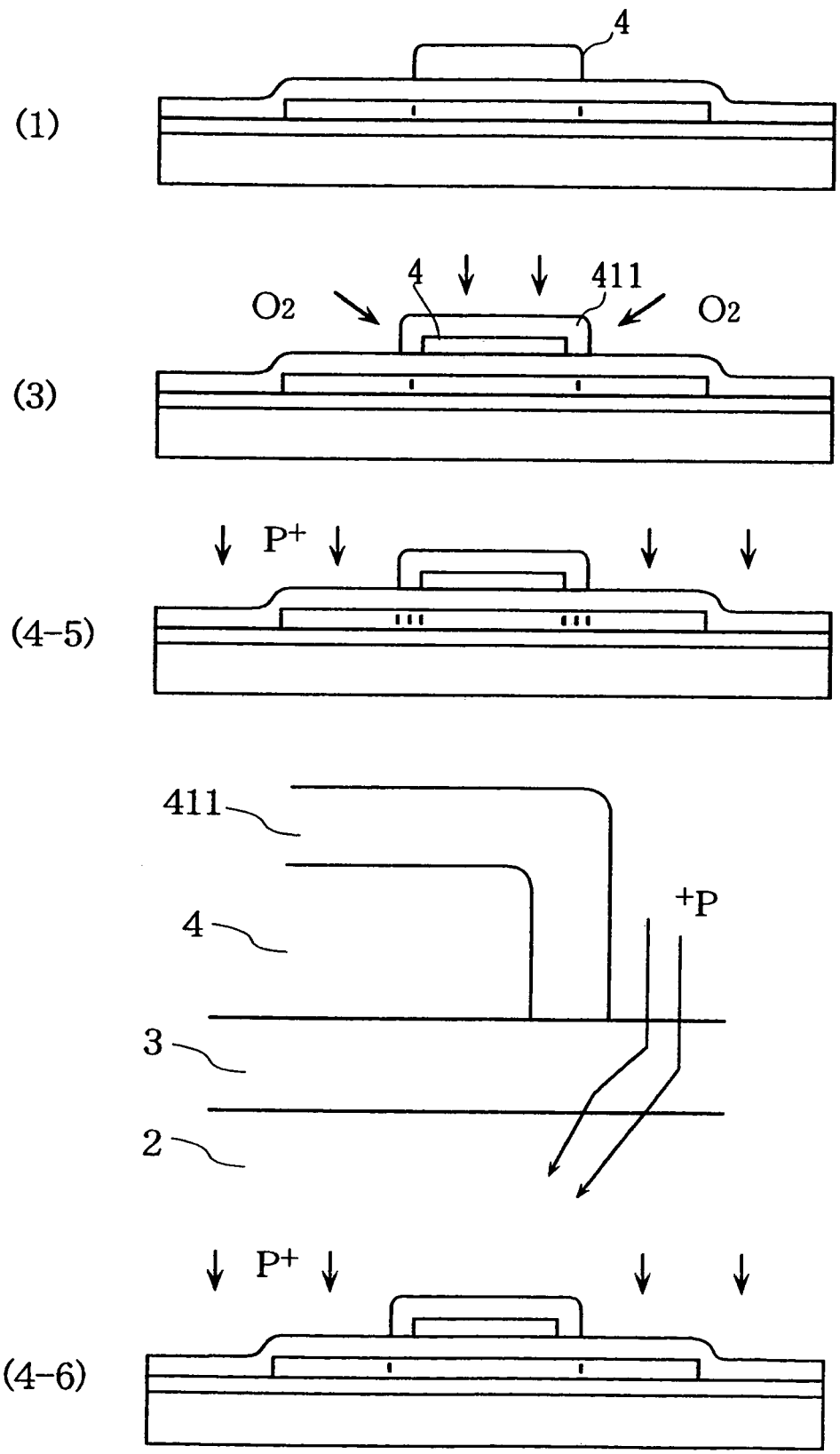
FIG. 22 shows the cross sections of the processes in the method of fabricating the thin film transistor of Embodiment 15 of the present invention.

FIG. 22 shows the processes in the method of fabricating the thin film transistor of the present embodiment. The procedure of the method will be described as follows with reference to the figure.

(1) A provisional gate electrode 4 is formed.

(2) An oxide film 411 is formed in the outer regions of the provisional gate electrode.

(4-5) Impurities are injected at comparatively high voltages and in predetermined concentrations under the conditions that the oxide film 411 is formed by a predetermined amount on the gate electrode 4.

In this case, the impurities having a high energy multiply collide with atoms and molecules of the gate insulator film 3 until the impurities stop, and the scattered impurities intrude into the regions of the polysilicon layer 2 that are directly below the metal oxide. As a result, LDD regions are formed. This is shown in the bottom of (4-5).

(4-4) Impurities are injected in high concentrations, if necessary.

The subsequent procedures are the same as in the aforementioned embodiments. The oxide film 411 is removed if necessary.

Embodiment 16

The present embodiment shows the thin film transistors fabricated in the embodiments of the second invention group.

Figure 23:
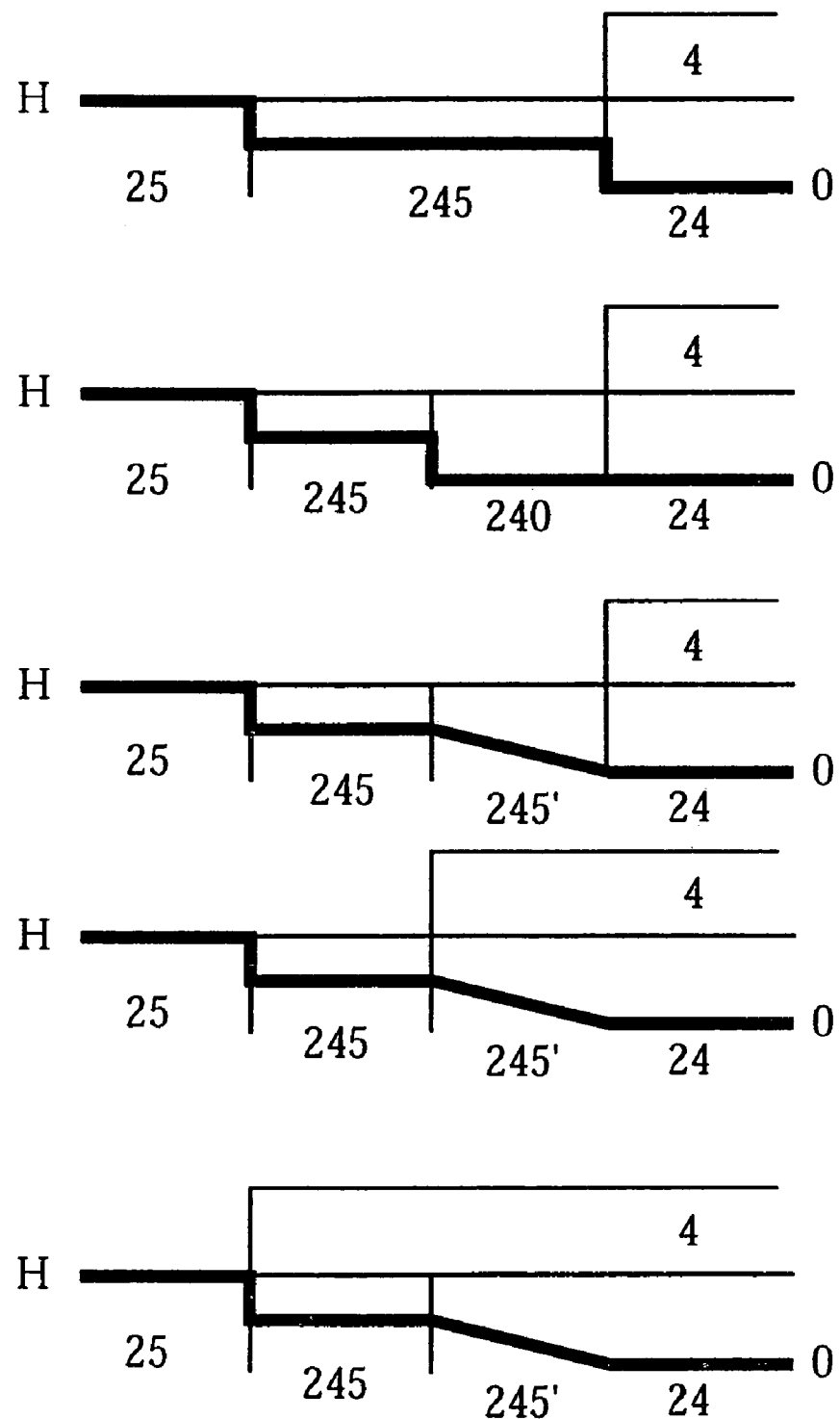
FIG. 23 shows the main parts of the thin film transistors of some embodiments of the present invention.

FIG. 23 shows relation to one other in each embodiment in layout of the gate electrode, LDD regions, and offset regions.

The diagram includes bold lines indicates impurity concentrations. Numeral 4 denotes the source-side portions of the gate electrodes. Numeral 24 denotes regions not doped with the impurities at all. Numeral 25 denotes heavily doped source-side regions. Numeral 245 denotes lightly doped source-side regions. Numeral 245' denotes lightly doped source-side regions formed by thermal diffusion or scattering. Numeral 240 denotes a source-side offset region.

These different structures change the properties of the thin film transistors so as to be applicable to various products.

Embodiment 1 of the Finished Product

The present embodiment relates to the application of the thin film transistor in each of the aforementioned embodiments to an EL display.

Figure 24:
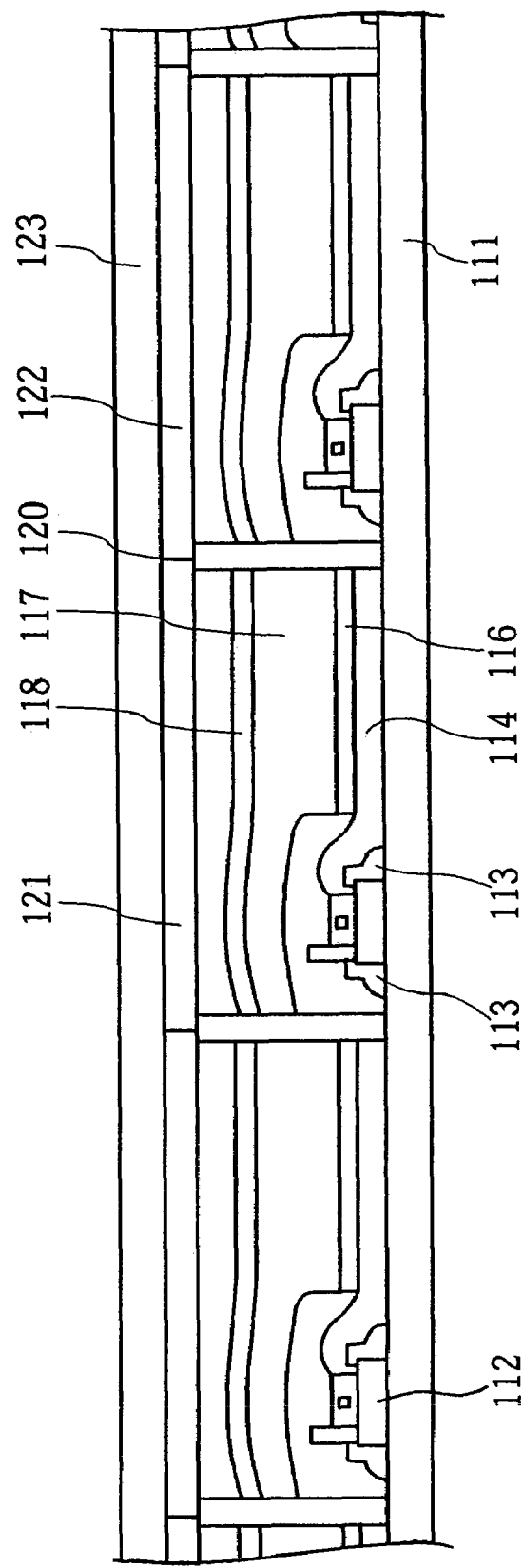
FIG. 24 shows the constitution of an EL display using the thin film transistor of the embodiments of the present invention.

FIG. 24 shows a typical constitution of the EL display. In the figure, numeral 111 denotes a glass substrate. Numeral 112 denotes a thin film transistor. Numeral 113 denotes an insulator film. Numeral 114 denotes a wiring electrode. Numeral 115 denotes a cathode. Numeral 117 denotes an organic EL layer. Numeral 118 denotes an anode. Numeral 120 denotes a supporting column. Numeral 121 denotes a color filter 121. Numeral 122 denotes a fluorescent converting layer. Numeral 123 denotes a transparent plate. The principle of the EL display is well known and so its description is omitted.

Embodiment 2 of the Finished Product

The present embodiment relates to the application of the thin film transistor in each of the aforementioned embodiments to a liquid crystal display.

Figure 25:
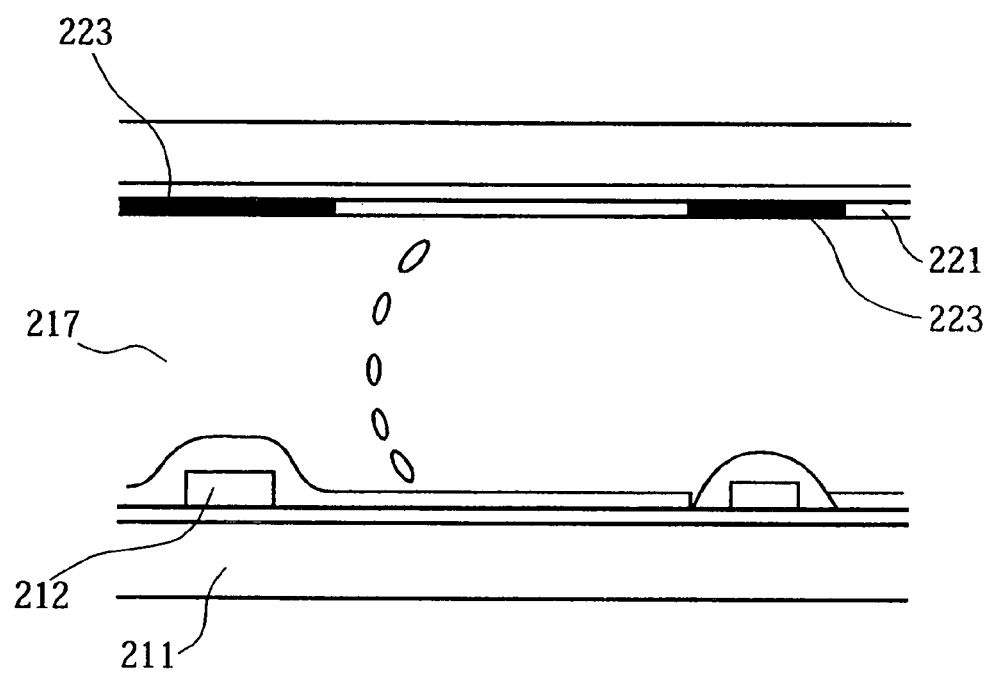
FIG. 25 shows the constitution of a liquid crystal display using the thin film transistor of the embodiments of the present invention.

FIG. 25 shows a typical constitution of the EL display. In the figures, numeral 211 denotes a glass substrate. Numeral 212 denotes a thin film transistor. Numeral 217 denotes a liquid crystal layer. Numeral 233 denotes a transparent plate. Numeral 221 denotes a color filter. Numeral 223 denotes a black matrix 223. Although being unillustrated, oriented film and various signal lines are also provided. The principle of the liquid crystal display is well known and so its description is omitted.

The present invention has been described based on the embodiments; however, it is not restricted to them, and the following modifications are applicable.

1) In each embodiment, plasma CVD is used to form a semiconductor; instead, decreased-pressure CVD or sputtering can be used.

2) In each embodiment, a polysilicon layer is used as the semiconductor material; instead, amorphous silicon or a single crystal silicon can be used. Furthermore, other semiconductor materials such as germanium (Ge), a silicon-germanium alloy (SiGe), or silicon-germanium-carbon, or the like can be used.

3) In each embodiment, in order to obtain the polysilicon, after depositing the amorphous silicon, a XeCl excimer laser is used for poly-crystallization; instead, other excimer lasers such as ArF and KrF or an Ar laser can be used. In addition, solid phase growth by annealing at about 600° C. can be used. It goes without saying that the solid phase growth requires a substrate resistant to the temperatures.

4) In each embodiment, after the crystallization, there is the additional process of improving crystalline by compensating the trap level on or inside the particles of the polysilicon layer by exposing the polysilicon layer to hydrogen plasmas or applying hydrogen annealing.

5) In each embodiment, $SiO_2$ is used as the interlayer insulator film obtained by plasma CVD with TEOS; instead, $SiO_2$ can be obtained by other methods such as AP (Atmospheric Pressure)-CVD or LTO (Low Temperature Oxide), or ECR-CVD. The interlayer insulator film can also be made from silicon nitride, tantalum oxide, aluminum oxide, or from a lamination of the thin films of these materials.

6) In each embodiment, the source and drain electrodes are made from Al solely; instead, these electrodes can be made from aluminum (Al), tantalum (Ta), molybdenum (Mo), chrome (Cr), titanium (Ti), or an alloy of these. In addition, polysilicon containing a large amount of impurities for conductivity improvement, an alloy of polysilicon and Ge, or a transparent conductive layer such as ITO can be used.

7) In each embodiment, phosphorus is used as the impurities; instead, it is possible to selectively use boron or arsenic as the acceptor, and aluminum or the like as the donor in place of phosphorus so as to fabricate the P channel transistor or the N channel transistor selectively, thereby mounting CMOS circuits on the substrate.

INDUSTRIAL APPLICABILITY

As described hereinbefore, according to the present invention, a gate electrode is used as a mask for impurity injection. This gate electrode is subjected to a chemical treatment to change its length in the channel direction, and before or after the change, impurities are doped. This makes mask positioning unnecessary, and LDD regions are formed in a self aligned manner or inevitably adjacent to the gate electrode.

Since various ideas are put into the shape and forming method of the photo resist when the gate electrode is formed by etching as the chemical treatment, the low-concentration impurity regions can be formed in minuscule size and with high definition even if the transistor size is as small as 2-4 µm.

As another chemical treatment, an oxide film is formed on the Mo—W alloy of the gate electrode so as to control the size of the mask precisely. By doing so, low-concentration impurity regions can be formed in minuscule size and with high precision as well.

Another advantage of the present invention not requiring a special process to form the low-concentration impurity regions in minuscule size can be carried out with ease in existing facilities.

What is claimed is:

1. A method for fabricating an LDD thin film transistor, comprising:
   forming a semiconductor layer on the substrate;
   forming a metal film on the semiconductor layer;
   making a provisional gate electrode from the metal film by using a resist, which has been hardened and patterned by photolithography and postbaking;
   injecting a first concentration of impurities into the semiconductor layer by using, as a mask, the provisional gate electrode having the resist used to form the provisional gate electrode remaining on the provisional gate electrode;
   moving both ends of the resist on the provisional gate electrode in a channel direction toward the center of the resist by etching, thereby exposing surfaces of both ends of the provisional gate electrode in the channel direction;
   etching the exposed both ends of the provisional gate electrode while using the remaining resist as a mask; and
   injecting a lower concentration of impurities lower then the first concentration into the semiconductor layer while using, as a mask, a gate electrode completed by etching the both ends of the provisional gate electrode.

2. The method for fabricating an LDD thin film transistor in accordance with claim 1, wherein forming a provisional gate electrode further comprises:
   applying a first resist having a postbaking temperature on the metal film for gate electrode formation;
   applying a second resist having postbaking temperatures lower than the first resist on the first resist;
   exposing the first resist and the second resist by using a mask for electrode formation, and then developing the first resist and the second resist;
   postbaking the first resist and the second resist at postbaking temperatures not causing the first resist to deform; and
   forming a provisional gate electrode by pattering the metal film for gate electrode formation by using the first resist and the second resist as a mask.

3. The method for fabricating an LDD thin film transistor in accordance with claim 1, wherein forming a provisional gate electrode further comprises prebaking the resist applied on the metal film for gate electrode formation at temperatures lower than the lowest temperature at which shape of the resist is maintained.

4. The method for fabricating an LDD thin film transistor in accordance with claim 3, wherein forming a provisional gate electrode further comprises exposing the resist on the metal film and patterning the resist under a defocused condition by photolithography.

5. The method for fabricating an LDD thin film transistor in accordance with claim 4, wherein forming a provisional gate electrode further comprises exposing the metal film for gate electrode formation with a perforated pattern photomask and a negative photo resist by photolithography.

6. The method for fabricating an LDD thin film transistor in accordance with claim 1, further comprising, prior to removing the resist, forming a hemisphere on a surface of the resist located on the provisional gate electrode by melting at a fixed temperature higher than the melting point or softening point of the provisional gate electrode.

7. The method for fabricating an LDD thin film transistor in accordance with claim 6, further comprising, prior to forming a hemisphere, selecting a melt flow resist as the resist.

8. The method for fabricating an LDD thin film transistor in accordance with claim 1, further comprising, prior to removing the resist, heat-shrinking a top surface of the resist formed on the gate electrode by heating the top surface at a temperature higher than the highest temperature at which the resist material does not deform, thereby broadening both ends of the resist.

9. The method for fabricating an LDD thin film transistor in accordance with claim 1, wherein removing the resist further comprises removing both end portions of the resist in a channel direction by ashing with a gas containing at least one component gas selected from the group of component gasses comprising $O_2$ and ozone.

10. A method for fabricating an LDD thin film transistor, comprising:
    forming a semiconductor layer on the substrate;
    forming a metal film on the substrate;
    coating the metal film with a resist for forming a gate electrode;
    processing the resist into a pattern corresponding to a desired gate electrode, the patterned resist having tapered side surfaces each with a projecting lower edge;
    forming a provisional gate electrode by etching the metal film while using the resist having tapered end surfaces as a mask;
    injecting a first concentration of impurities into the semiconductor layer while using, as a mask, the provisional gate electrode having the resist with tapered side surfaces thereon;
    etching the resist to remove both end portions in the channel direction of the resist, thereby exposing both ends of the gate electrode in the channel direction;
    removing the exposed both ends of the gate electrode while using the remaining resist as a mask; and
    injecting a lower concentration of impurities lower than the first concentration into the semiconductor layer while using, as a mask, the gate electrode with both ends removed.

11. The method for fabricating an LDD thin film transistor in accordance with claim 10, wherein processing the resist further comprises melting with heat the patterned resist and shaping the patterned resist into a hemisphere.

12. The method for fabricating an LDD thin film transistor in accordance with claim 10, wherein processing the resist further comprises heating a top portion of the patterned resist on the metal film to shrink a top portion of the patterned resist, said heating at temperatures higher than a highest temperature at which shape of the resist is maintained.

13. The method for fabricating an LDD thin film transistor in accordance with claim 10, wherein processing the resist further comprises prebaking the patterned resist at lower temperatures than at the lowest temperature at which shape of the resist is maintained.

14. The method for fabricating an LDD thin film transistor in accordance with claim 13, wherein processing the resist further comprises exposing the resist on the metal film and patterning the resist under a defocused condition by photolithography.

15. The method for fabricating an LDD thin film transistor in accordance with claim 14, wherein processing the resist further comprises exposing the metal film for gate electrode formation with a perforated pattern photomask and a negative photo resist by photolithography.

16. The method for fabricating an LDD thin film transistor in accordance with claim 10, wherein processing the resist further comprises removing the tapered end surfaces with an area-proportional chemical reaction of the resist.

17. The method for fabricating an LDD thin film transistor in accordance with claim 10, wherein etching the resist further comprises removing both end portions of the resist in the channel direction are removed by means of ashing with a gas containing at least one component gas selected from the group of component gasses consisting of $O_2$ and ozone.

18. A method for fabricating an offset thin film transistor comprising:
    forming a semiconductor layer on the substrate;
    forming a metal film on the semiconductor layer;
    making a provisional gate electrode from the metal film for gate electrode formation by using a resist;
    injecting impurities into the semiconductor layer while using, as a mask, the provisional gate electrode having the resist used to form the provisional gate electrode remaining on the provisional gate electrode;
    processing the resist to form a pair of tilted end surfaces each with a projecting lower edge for forming in a channel direction the provisional gate electrode, before the making a provisional gate electrode or before or after the injecting impurities;
    moving both ends of the resist on the provisional gate electrode in the channel direction toward the center of the resist by etching the resist, thereby exposing both ends of the provisional gate electrode in the channel direction; and
    etching exposed both ends of the provisional gate electrode while using the remaining resist as a mask.

19. A method for fabricating an LDD thin film transistor comprising:
    sequentially stacking a gate electrode, a gate insulator film, and a semiconductor layer onto a front surface of a substrate;
    forming a metal film for an impurity injection mask on the semiconductor layer;
    forming a resist film on the metal film;
    patterning the resist film by exposing from a rear side of the substrate by using the gate electrode as an exposure mask;
    patterning the metal film for forming a first impurity injection mask by using the patterned resist film as a mask;
    injecting a first concentration of impurities from a front side of the substrate while using the first impurity injection mask as a mask;
    treating the patterned resist on the patterned first impurity injection mask to have tilting side surfaces of both ends of the patterned resist in the channel direction towards the center of the resist;
    moving both ends of the resist in a channel direction towards the center of the resist, thereby exposing both ends of the first impurity injection mask located under the resist, the resist having the side surfaces of both ends thereof tilted in the channel direction towards the center of the resist;

removing the exposed both ends of the first impurity injection mask while using the remaining resist as a mask to form a second impurity injection mask; and injecting a lower concentration of impurities lower than the first concentration from the front side of the substrate while using the second impurity injection mask as a mask.

20. A method for fabricating an LDD thin film transistor comprising:

sequentially stacking a gate electrode, a gate insulator film, a semiconductor layer, and a protective insulator film onto a front surface of a substrate;

forming a metal film mask on the semiconductor layer;

forming a resist film on the metal mask;

patterning the resist film by exposing from a rear side of the substrate while using the gate electrode as an exposure mask;

patterning the metal film to form a first impurity injection mask while using the patterned resist film as a mask;

injecting a first concentration of impurities from a front side of the substrate while using the first impurity injection mask as a mask;

tilting side surfaces of both ends of the patterned resist on the patterned first impurity injection mask in the channel direction towards the center of the patterned resist;

moving both ends of the resist in a channel direction towards the center of the resist, thereby exposing both ends of the first impurity injection mask provided under the resist which is so processed that the side surfaces of both ends thereof are tilted in the channel direction towards the center of the resist;

removing exposing both ends of the first impurity injection mask while using the remaining resist as a mask; and injecting a lower concentration of impurities lower than the first concentration from the front side of the substrate while using the second impurity injection mask as a mask.

21. A method of fabricating an LDD thin film transistor comprising:

injecting a first concentration of impurities while using, as a mask, a gate electrode made from a metal film of 300-500 nm-thick;

forming reaction product films of 0.075-0.5 µm-long oxide films of the gate electrode material metal at both ends of the gate electrode in a channel direction by applying a reactive fluid to the gate electrode; and injecting a higher concentration of impurities higher than the first concentration while using, as a mask, the gate electrode having the reaction product films at both ends thereof in the channel direction provided in the reaction product film-forming step.

22. The method of fabricating an LDD thin film transistor in accordance with claim 21, wherein forming reaction product films oxidizes with heat the gate electrode material metal to form a thermal oxide film.

23. The method of fabricating an LDD thin film transistor in accordance with claim 22, further comprising selecting an Mo—W alloy having Mo content of 15-50 atom % as a material of the gate electrode.

24. A method of fabricating an LDD thin film transistor, comprising:

injecting a first concentration of impurities into a semiconductor layer while using, as a mask, a gate electrode made from a metal film of 300-500 nm-thick;

forming reaction product films of 0.075-0.5 µm long oxide films of the gate electrode material metal at both ends of the gate electrode in a channel direction by applying a reactive fluid to the gate electrode;

injecting a higher concentration of impurities higher than the first concentration while using, as a mask, the gate electrode having the reaction product films at both ends thereof in the channel direction provided in forming reaction product films; and removing the reaction product films of the oxide films of the metal in both ends of the gate electrode in the channel direction formed in forming reaction product films.

25. The method of fabricating an LDD thin film transistor in accordance with claim 24, wherein forming reaction product films further comprises forming a thermal oxide film as the reaction product film by oxidizing the gate electrode material metal with heat.

26. A method of fabricating an LDD thin film transistor, comprising:

forming reaction product films of 0.075-0.5 µm long oxide films of the gate electrode material metal at both ends of the gate electrode in a channel direction by applying a reactive fluid to the gate electrode made of a metal film of 300-500 nm-thick;

injecting a first concentration of impurities while using, as a mask, the gate electrode having the reaction product films at both ends thereof in the channel direction provided in forming reaction product films;

removing the reaction product films of the oxide films of the metal in both ends of the gate electrode in the channel direction formed in forming reaction product films; and injecting a lower concentration of impurities lower than the first concentration while using, as a mask, the gate electrode from which the reaction product films have been removed.

27. The method of fabricating an LDD thin film transistor in accordance with claim 26, wherein formingreaction product films further comprises forming a thermal oxide film as the reaction product film by oxidizing the gate electrode material metal with heat.

28. A method of fabricating an LDD thin film transistor, comprising:

injecting a first concentration of impurities while using, as a mask, a gate electrode made of a metal film of 300-500 nm thick;

forming reaction product films of 0.075-0.5 µm-long oxide films of the gate electrode material metal at both ends of the gate electrode in a channel direction by applying a reactive fluid to the gate electrode;

injecting a higher concentration of impurities higher than the first concentration while using, as a mask, the gate electrode having the reaction product films at both ends thereof in the channel direction provided in the reaction product film forming step; and returning the reaction product films of oxide films of the metal in both ends of the gate electrode in a channel direction formed in forming reaction product films to an original metal through a reverse reaction comprising reduction.

29. The method of fabricating an LDD thin film transistor in accordance with claim 28, wherein forming reaction product films further comprises forming a thermal oxide film as the reaction product film by oxidizing the gate electrode material metal with heat.

30. The method of fabricating an LDD thin film transistor in accordance with claim 28, wherein the gate electrode is made of an Mo—W alloy having Mo content of 15-50 atom %.

31. A method of fabricating an LDD thin film transistor, comprising:

forming 0.05-0.5 µm-thick oxide films of the gate electrode material metal at both ends of a gate electrode in the channel direction by partly oxidizing the gate electrode which is made of a 300-500 nm-thick metal film; and injecting impurities from both sides in the channel direction at the same time or in two installments while using, as a mask, the gate electrode provided with the oxide films.

32. A method of fabricating an LDD thin film transistor, comprising:

forming 0.05-0.5 µm-long oxide films at both ends of a gate electrode in the channel direction by partly oxidizing the gate electrode which is made of a 300-500 nm-thick metal film;

injecting impurities while using, as a mask, the gate electrode provided with the oxide films; and further dispersing the impurities which have been injected and diffused towards the center of the gate electrode in the channel direction when a semiconductor is heat-processed after impurity injection or when the oxide films formed in both ends of the gate electrode are heated removed or reduced.

33. A method of fabricating an offset thin film transistor, comprising:

forming reaction product films of oxide films of a 0.075-0.5 µm-long gate electrode material metal at both ends of the gate electrode in a channel direction by thermally oxidizing the gate electrode which is made of a 300-500 nm-long metal film;

injecting impurities into the semiconductor layer while using, as a mask, the gate electrode provided with the reaction product films; and removing the metal oxide films in both ends of the gate electrode in the channel direction after injecting the impurities.

34. The method of fabricating an offset thin film transistor in accordance with claim 33, wherein semiconductor material of the offset thin film transistor is polysilicon.

* * * * *

UNITED STATES PATENT AND TRADEMARK OFFICE
CERTIFICATE OF CORRECTION

PATENT NO. : 7,306,980 B2 Page 1 of 1
APPLICATION NO. : 10/872101
DATED : December 11, 2007
INVENTOR(S) : Shin-itsu Takehashi et al.

It is certified that error appears in the above-identified patent and that said Letters Patent is hereby corrected as shown below:

Column 24, line 34, "then" should read --than--.

Signed and Sealed this

Twenty-fourth Day of June, 2008

JON W. DUDAS
*Director of the United States Patent and Trademark Office*